(12) United States Patent
Chang et al.

(10) Patent No.: US 8,324,547 B2
(45) Date of Patent: Dec. 4, 2012

(54) SOLAR TRACKING AND CONCENTRATION DEVICE

(75) Inventors: Yi-Chieh Chang, Taichung County (TW); Yarn-Chen Chen, Hsinchu (TW)

(73) Assignee: Sunplus mMedia Inc., Hsinchu (TW)

( * ) Notice: Subject to any disclaimer, the term of this patent is extended or adjusted under 35 U.S.C. 154(b) by 0 days.

(21) Appl. No.: 13/342,980

(22) Filed: Jan. 4, 2012

(65) Prior Publication Data

US 2012/0097214 A1    Apr. 26, 2012

Related U.S. Application Data

(62) Division of application No. 12/436,112, filed on May 5, 2009, now Pat. No. 8,129,668.

(30) Foreign Application Priority Data

Sep. 10, 2008   (TW) .............................. 97134723 A

(51) Int. Cl.
*H01L 31/052* (2006.01)
*F24J 2/38* (2006.01)
*G01J 1/20* (2006.01)

(52) U.S. Cl. ...................... 250/203.4; 136/246; 126/574

(58) Field of Classification Search ............... 250/203.1, 250/203.3, 203.4; 136/244, 246; 126/572–574, 126/600, 684

See application file for complete search history.

(56) References Cited

U.S. PATENT DOCUMENTS 4,256,088 A * 3/1981 Vindum ......................... 126/571
2005/0034751 A1 * 2/2005 Gross et al. .................... 136/246

FOREIGN PATENT DOCUMENTS

JP              05033013        * 4/1993

* cited by examiner

*Primary Examiner* — Kevin Pyo
(74) *Attorney, Agent, or Firm* — Jianq Chyun IP Office

(57) ABSTRACT

A solar tracking and concentration device, including at least one reflecting unit, a receiving unit, a controlling device, and a sensing device, is provided. The reflecting unit having a reflecting surface reflects and concentrates sunlight. The receiving unit having a receiving surface is used to receive the sunlight reflected and reflected by the reflecting unit. The receiving unit and the reflecting unit face each other. According to the position and the time of the reflecting unit, the controlling device controls a rotation angle of the reflecting unit. The sensing device on the receiving unit may detect an inclination direction of the reflecting unit and output a first feedback signal to the controlling device to calibrate a direction of the reflecting unit facing the sun.

26 Claims, 22 Drawing Sheets

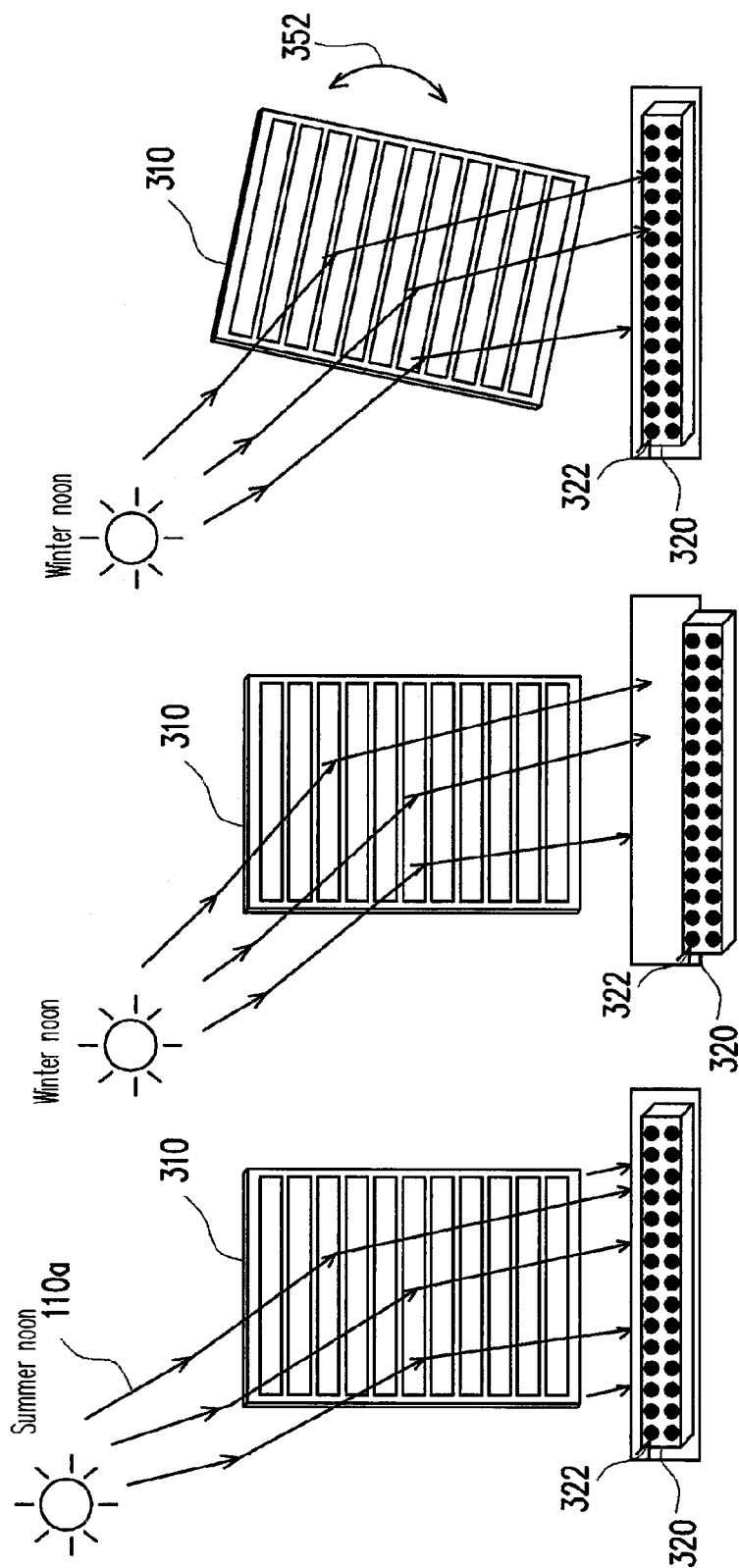

SOLAR TRACKING AND CONCENTRATION DEVICE

CROSS-REFERENCE TO RELATED APPLICATION

This application is a divisional application of and claims the priority benefit of U.S. application Ser. No. 12/436,112, filed on May 5, 2009, now allowed, which claims the priority benefit of Taiwan application serial no. 97134723, filed Sep. 10, 2008. The entirety of each of the above-mentioned patent applications is hereby incorporated by reference herein and made a part of specification.

BACKGROUND OF THE INVENTION

1. Field of the Invention

The present invention generally relates to a tracking and concentration device, in particular, to a solar tracking and concentration device.

2. Description of Related Art

Solar energy is a renewable and pollution free energy source, and is always the center of attention during the process of solving the recent pollution and shortage problem of the petrochemical energy source. Particularly, a solar panel has a photovoltaic cell (PV cell), so the solar panel may directly convert the optical energy to the electric energy. However, recently it is a quite important research topic how to make the solar panel have the higher photoelectric conversion efficiency.

Generally speaking, if the solar panel may face the sun at any moment, the photoelectric conversion efficiency of the conventional solar panel which is fixedly disposed may be greatly improved by 25% to 40%. In addition, with the rotation of the Earth, the moving position of the sun everyday is from east to west, and an inclination angle between the earth's rotation axis and the ecliptic is 23.5 degrees, such that the moving position of the sun of the whole year is from south to north. Therefore, if it intends to exactly track the sun to obtain the higher photoelectric conversion efficiency, at least a uniaxial solar tracking device must be used, such that the solar panel is made to effectively face the sun.

In addition, if the sunlight is concentrated to improve the intensity of the light irradiating on the solar panel per unit area, the photoelectric conversion efficiency of the solar panel may be greatly improved. For example, in the recently well-known high concentration photovoltaic (HCPV) solar panel system, the total photoelectric conversion efficiency is improved in the manner of concentrating the sunlight.

However, in the conventional solar tracking and concentration device, usually the operation thereof is controlled by adopting a relatively complicated mechanical actuation, and thus the fabricating cost is increased and the complexity during the operation is increased, thereby reducing the reliability.

SUMMARY OF THE INVENTION

Accordingly, the present invention is directed to a solar tracking and concentration device, which has preferred photoelectric conversion efficiency, and relatively simpler solar tracking mechanism, thereby reducing the fabricating cost.

The present invention is also directed to a solar tracking and concentration device, which has a relatively stable mechanical actuation mechanism during operation besides the above-mentioned efficacies.

The present invention is directed to a solar concentration device, which has a simpler solar concentration mechanism and a lower fabricating cost.

The present invention provides a solar tracking and concentration device, which includes a reflecting unit, a receiving unit, a controlling device, and a plurality of photo sensors. The reflecting unit reflects and concentrates sunlight. The receiving unit receives the sunlight reflected by the reflecting unit. The receiving unit and the reflecting unit face each other. The receiving unit is adapted to move along a first direction. The controlling device is adapted to control a rotation angle of a support element and control a first moving position of the receiving unit moving along the first direction according to a position and a time of the reflecting unit, in which the support element supports the reflecting unit and the receiving unit. The photo sensors are disposed on the periphery of the receiving unit, for example, corners or surrounding edges. The photo sensors detect the sunlight reflected by the reflecting unit to the receiving unit, and are adapted to output a first feedback signal to calibrate a direction of the receiving unit facing the reflecting unit.

The present invention also provides a solar tracking and concentration device, which includes a plurality of reflecting units, a receiving unit, a controlling device, and a plurality of photo sensors. The reflecting units reflect and concentrate sunlight, in which each reflecting unit has a reflecting surface. The receiving unit receives the sunlight reflected by one of the reflecting units, in which the receiving unit and one of the different reflecting units face each other under different times. In addition, the receiving unit is adapted to move along a first direction. The controlling device is adapted to control a rotation angle of the receiving unit facing one of the reflecting units and control a first moving position of the receiving unit moving along the first direction according to positions of the reflecting units and the time. The photo sensors are disposed on the periphery of the receiving unit, for example, corners or surrounding edges, in which the photo sensors detect the sunlight reflected by one of the reflecting units to the receiving unit, and are adapted to output a first feedback signal to the controlling device to calibrate a direction of the receiving unit facing one of the reflecting units.

The present invention provides a solar tracking and concentration device, which includes at least one reflecting unit, a receiving unit, a controlling device, and a sensing device. The reflecting unit reflects and concentrates sunlight, and has a reflecting surface. The receiving unit receives the sunlight reflected by the reflecting unit, and has a receiving surface, in which the receiving unit and the reflecting unit face each other. The controlling device controls a rotation angle of the reflecting unit according to a position and a time of the reflecting unit. The sensing device is disposed on the receiving unit to detect an inclination direction of the reflecting unit, and is adapted to output a first feedback signal to the controlling device to calibrate a direction of the reflecting unit facing the sun.

The present invention further provides a solar concentration device, which includes a reflecting unit, a plurality of receiving units, and a support element. The reflecting unit reflects and concentrates sunlight, and has a reflecting surface. The plurality of receiving units each has different heights to respectively receive sunlight reflected by the reflecting unit under different times. Each receiving unit has a receiving surface, in which each receiving surface faces the reflecting surface. The support element supports the reflecting unit and the receiving units.

In an embodiment of the present invention, the controlling device includes a real time clock (RTC), a micro control unit (MCU), a memory storage unit, a tracking control unit, a first rotation control unit, and an input/output unit. The RTC is adapted to generate a time signal of the reflecting unit. The MCU generates a control sequence signal according to a position signal of the reflecting unit and the time signal. The memory storage unit stores the position signal, the time signal, and the control sequence signal. The tracking control unit is adapted to accept the control sequence signal to respectively control the first moving position of the receiving unit moving along the first direction, and to control the first direction of the receiving unit. The first rotation control unit is adapted to accept the control sequence signal to control the rotation angle of the support element connecting the reflecting unit and the receiving unit. The input/output unit is adapted to deliver the first feedback signal of the photo sensors to calibrate the direction of the receiving unit facing the reflecting unit.

To sum up, the solar tracking and concentration device of the present invention is adapted to control the receiving unit to move along the first direction to receive the sunlight reflected and concentrated by the reflecting unit, and to control the rotation angle of the support element connecting the reflecting unit and the receiving unit, according to the position and the time of the reflecting unit, such that the solar tracking and concentration device has a preferred photoelectric conversion efficiency and a three-dimensional solar tracking mechanism.

In addition, the solar tracking and concentration device may further use a plurality of reflecting units, control the receiving unit to move along the first direction, and control the rotation angle of the receiving unit facing one of the plurality of reflecting units, according to the positions and the times of the reflecting units, such that the receiving unit may receive the sunlight reflected by the reflecting units at any moment under different times, so as to achieve a simple tracking mechanism. In other words, the solar tracking and concentration device of the present invention has a preferred photoelectric conversion efficiency, a simpler solar tracking mechanism, and a stable mechanical actuation. In addition, the present invention also provides a solar tracking and concentration method having the above-mentioned efficacies.

In order to have a further understanding of the above and other objective, features, and efficacies of the present invention, a detailed description is given below with embodiments and accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 8C is a schematic view in which the reflecting unit reflects the sunlight to the receiving unit at summer noon.

FIGS. 8D and 8E are schematic flow charts in which a rotation angle of the reflecting unit is adjusted to reflect the sunlight to the receiving unit at winter noon.

DESCRIPTION OF THE EMBODIMENTS

Figure 1A:
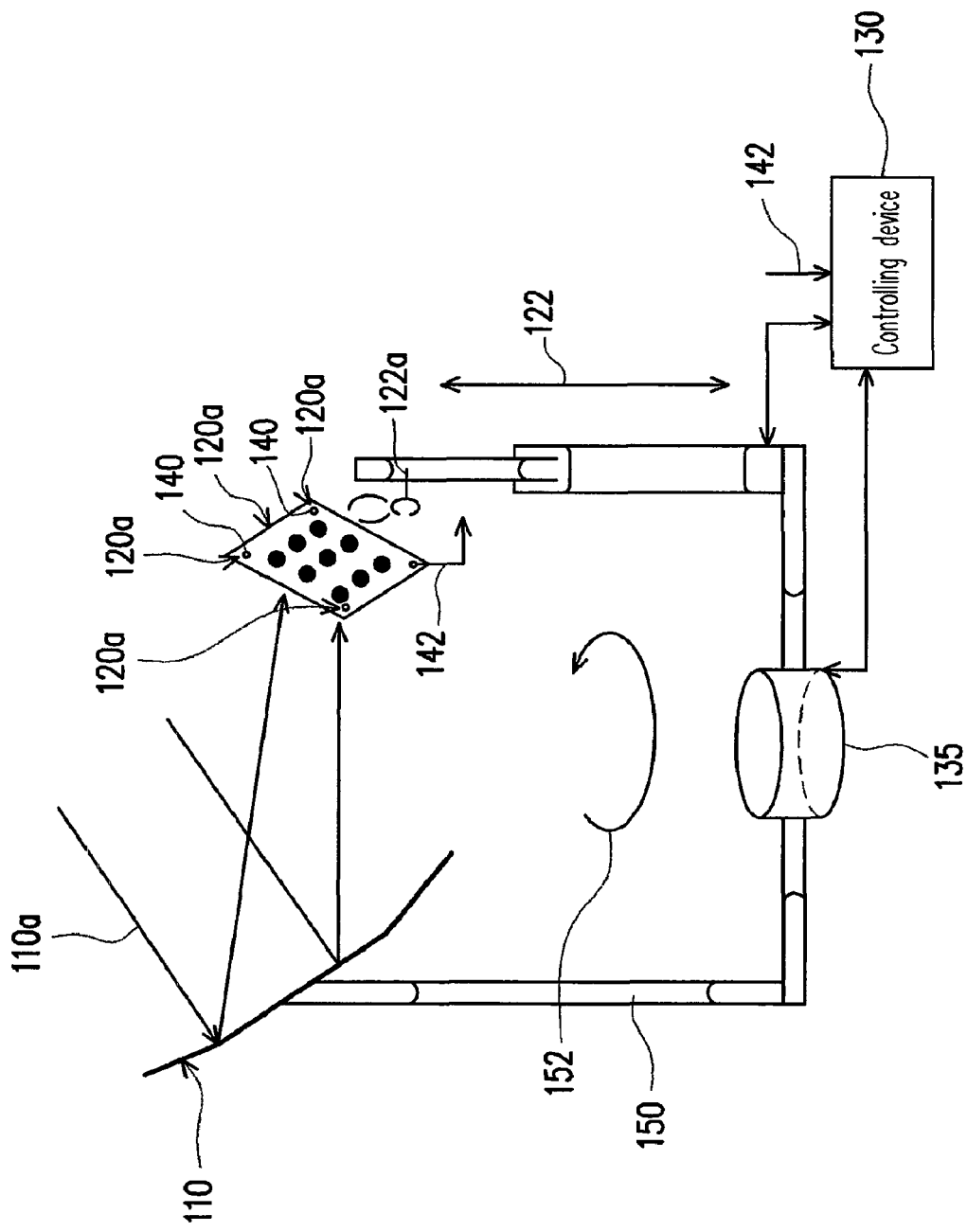
FIG. 1A is a schematic side view of a solar tracking and concentration device according to a first embodiment of the present invention.

Reference will now be made in detail to the present embodiments of the invention, examples of which are illustrated in the accompanying drawings. Wherever possible, the same reference numbers are used in the drawings and the description to refer to the same or like parts.

First Embodiment

FIG. 1A is a schematic side view of a solar tracking and concentration device according to a first embodiment of the present invention. Referring to FIG. 1A, a solar tracking and concentration device 100 of this embodiment includes a reflecting unit 110, a receiving unit 120, a controlling device 130, and a plurality of photo sensors 140. The reflecting unit 110 reflects and concentrates sunlight 110a. The receiving unit 120 receives the sunlight 110a reflected by the reflecting unit 110. The receiving unit 120 and the reflecting unit 110 are disposed face to face, and the receiving unit 120 is adapted to move along a first direction 122, as shown in FIG. 1A.

Referring to FIG. 1A, the controlling device 130 controls a rotation angle 152 of a support element 150 and controls a first moving position 122a of the receiving unit 120 moving along the first direction 122, according to a position and a time of the reflecting unit 110. The support element 150 supports the reflecting unit 110 and the receiving unit 120. The photo sensors 140 are disposed on the periphery 120a of the receiving unit 120, for example, corners or surrounding edges. The photo sensors 140 detect the sunlight 110a reflected by the reflecting unit 110 to the receiving unit 120, and are adapted to output a first feedback signal 142 to the controlling device 130 to calibrate a direction of the receiving unit 120 facing the reflecting unit 110.

In this embodiment, the controlling device 130 calculates the current position of the sun according to the position and the time of the reflecting unit 110, so as to directly control the rotation of the reflecting unit 110 and the receiving unit 120 through the first rotation control unit 135, and to control the receiving unit 120 to move along the first direction 122, such that the reflecting unit 110 may effectively reflect the sunlight 110a to the receiving unit 120. In other words, the solar tracking and concentration device 100 of this embodiment has a three-dimensional actuation mechanism to omni-directionally track the sun.

In this embodiment, in addition to reflecting the sunlight 110a, the reflecting unit 110 may further concentrate the sunlight 110a on the receiving unit 120. In other words, the reflecting unit 110 may improve the intensity of the light received by the receiving unit 120 per unit area, such that the solar tracking and concentration device 100 has a preferred photoelectric conversion efficiency. In addition, in the solar tracking and concentration device 100, the photo sensors 140 are further disposed on the receiving unit 120, so as to calibrate the direction of the receiving unit 120 facing the reflecting unit 110. In this manner, the solar tracking and concentration device 100 may track the sun more exactly, thereby improving the total performance.

In the following, connection relations of various members and the actuation mechanism of the solar tracking and concentration device 100 of this embodiment are described in detail.

Figure 1B:
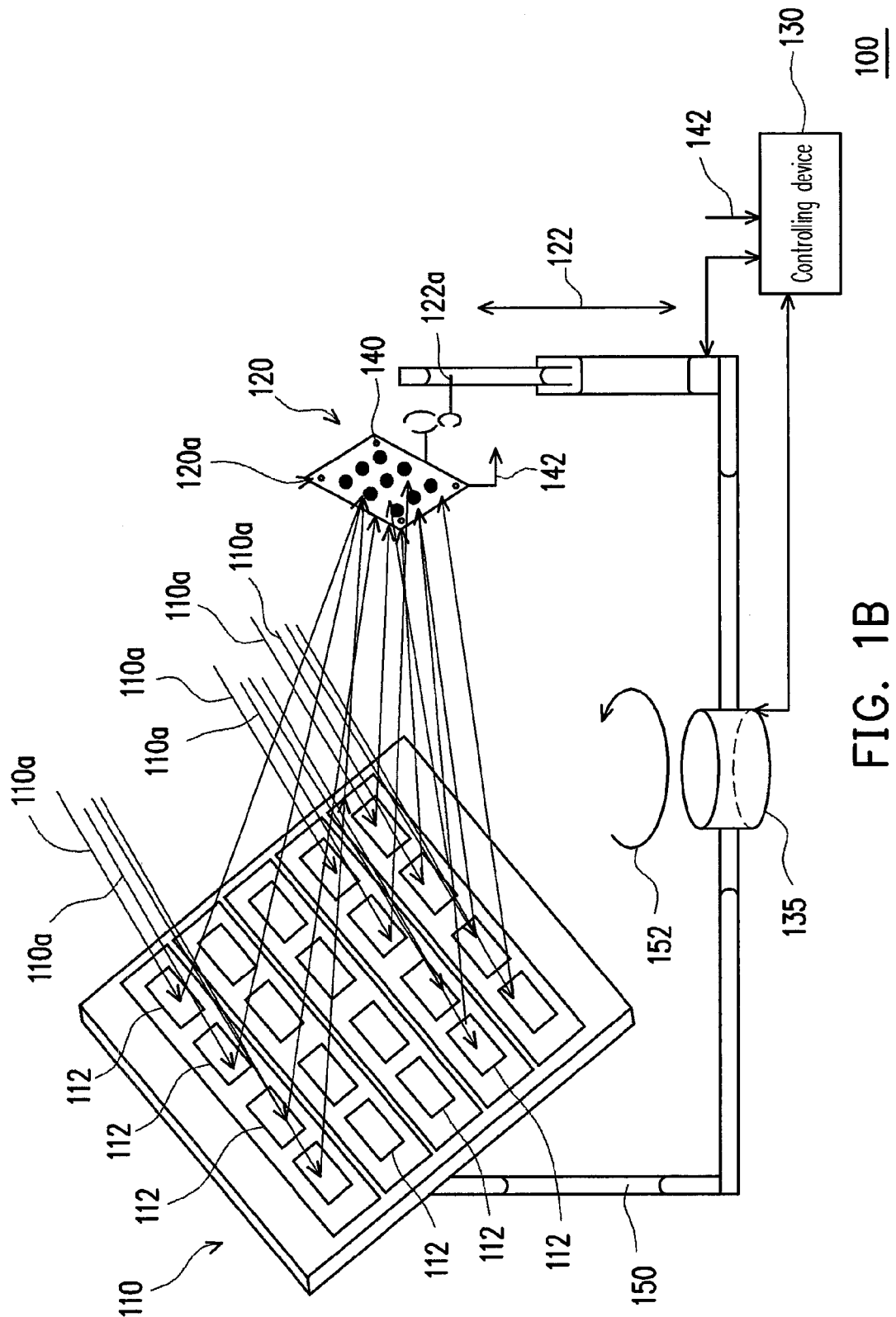
FIG. 1B is a schematic view in which a reflecting unit of FIG. 1A reflects sunlight to a receiving unit.

FIG. 1B is a schematic view in which the reflecting unit of FIG. 1A reflects the sunlight to the receiving unit. Referring to FIGS. 1A and 1B, the reflecting unit 110 of this embodiment has a plurality of reflecting mirrors 112, and each reflecting mirror 112 is adapted to reflect the sunlight 110a on the receiving unit 120.

Particularly, the reflecting unit 110 may have different implementations, such that each reflecting mirror 112 of the reflecting unit 110 may reflect the sunlight 110a on the receiving unit 120. For example, if a surface of the reflecting unit 110 is a plane, and the plurality of reflecting mirrors 112 is disposed on the plane, the plurality of reflecting mirrors 112 is adapted to have different inclination angles (not shown), such that each reflecting mirror 112 may reflect the sunlight 110a on the receiving unit 120. Alternatively, the surface of the reflecting unit 120 is a curved surface (for example, a curved surface shape of a concave mirror), and the plurality of reflecting mirrors 112 is disposed on the curved surface, the reflecting mirrors 112 may be directly disposed on or attached to the curved surface, so as to reflect the sunlight 110a on the receiving unit 120. In addition, according to different demands of the users, the reflecting mirrors 112 may adopt other disposing manners and design manners, the above description is only exemplary, instead of limiting the present invention. In this embodiment, the reflecting mirrors 112 reflect the sunlight 110a on the receiving unit 120, and a total area of the reflecting mirrors 112 is larger than a sensing area of the receiving unit 120, thus improving the intensity of the light sensed by the receiving unit 120 per unit area.

In the embodiment, the reflecting mirror 112 may be a plane mirror, as shown in FIG. 1B. In an embodiment, the reflecting mirror 112 may also be a concave mirror, in which the manner of disposing the concave mirror on the reflecting unit 110 uses, for example, the above-mentioned concept, so it is not repeated here. In another embodiment, the reflecting unit 110 may be a concave mirror, in which the concave mirror is adapted to reflect and concentrate the sunlight 110 on the receiving unit 120.

Referring to FIGS. 1A and 1B, the solar tracking and concentration device 100 may be affected by the external environment, for example, wind or shock, to result in offset and error of the direction of the receiving unit 120 facing the reflecting unit 110, thus affecting the intensity of the light received by the receiving unit 120 per unit area. In order to avoid the above situation, in the solar tracking and concentration device 100, the plurality of photo sensors 140 is disposed on the corners of the receiving unit 120 to detect and calibrate the direction of the receiving unit 120 facing the reflecting unit 110, as shown in FIGS. 1A and 1B. Alternatively, the photo sensors 140 may be respectively disposed around the receiving unit 120, for example, symmetrically disposed on the four edges.

Particularly, the photo sensors 140 sense the light intensity distribution of the sunlight 110a irradiating on the receiving unit 120, so as to determine whether the direction of the receiving unit 120 facing the reflecting unit 110 is calibrated or not according to the light intensity distribution. In this embodiment, the photo sensors 140 may be disposed on the four corners of the receiving unit 120, as shown in FIG. 1A or 1B. If the four photo sensors 140 sense the same light intensity value, it indicates that the receiving unit 120 effectively faces the reflecting unit 110. On the contrary, it indicates that receiving unit 120 is calibrated faces the reflecting unit 110. In other words, when the four photo sensors 140 sense different light intensity values, it is necessary to appropriately adjust the direction of the receiving unit 120 facing the reflecting unit 110 until the light intensity values detected by the four photo sensors 140 are the same. In this embodiment, the direction of the receiving unit 120 facing the reflecting unit 110 may be calibrated and adjusted by adjusting the receiving unit 120 to move along the first direction 122, or by adjusting the rotation angle 152 of the support element 150.

In the above-mentioned, as an implementation example, the photo sensors 140 are disposed on the four corners of the receiving unit 120. However, according to the design and the demand of the user, the photo sensors 140 may also be disposed on the receiving unit 120 at other positions, and the above-mentioned is only an exemplary description. Preferably, the photo sensors 140 may be symmetrically arranged on the receiving unit 120 in pairs.

In this embodiment, the receiving unit 120 may be a photoelectric unit adapted to convert the sunlight 110a to an electric energy. For example, the photoelectric unit may be a solar panel or other appropriate photoelectric devices. In this embodiment, as an implementation example, the photoelectric unit is, but not limited to, the solar panel.

In another implementation aspect, the receiving unit 120 may be a photo-thermal unit adapted to convert the sunlight 110a to a thermal energy. For example, the photo-thermal unit may be a heating device. In an implementation aspect, the heating device uses, for example, water as a medium. That is to say, when the sunlight 110a irradiates on the water, water molecules are adapted to accept the energy of the sunlight 110a, so as to raise the water temperature. Accordingly, the denser the sunlight 110a irradiating on the water is, the higher the energy obtained by the water molecules is, and the higher the water temperature is.

Figure 1C:
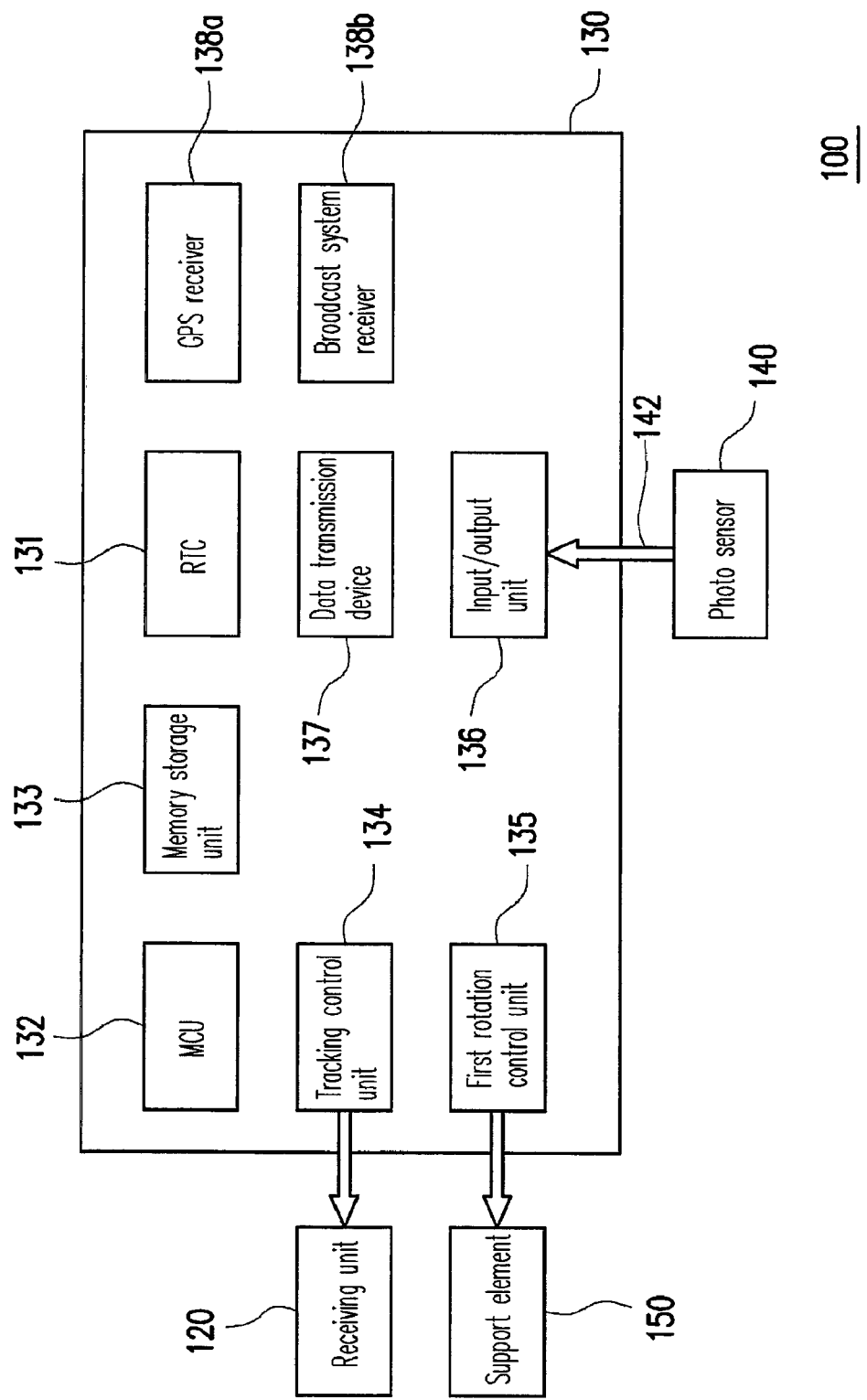
FIG. 1C is a systematic block diagram of the solar tracking and concentration device of FIG. 1A.

In addition, FIG. 1C is a systematic block diagram of the solar tracking and concentration device of FIG. 1A. Referring to FIGS. 1A and 1C, in this embodiment, the controlling device 130 includes a real time clock (RTC) 131, a micro control unit (MCU) 132, a memory storage unit 133, a tracking control unit 134, a first rotation control unit 135, and an input/output unit 136.

In this embodiment, the RTC 131 is adapted to generate a time signal of the reflecting unit 110, and the time signal may be delivered to the MCU 132 or the memory storage unit 133. The MCU 132 generates a control sequence signal according to a position signal of the reflecting unit 110 and the time signal, the position signal may be generated by the MCU 132 or by an external positioning generator (not shown), and is delivered to the MCU 132. The position signal is one selected from among a longitude signal, a latitude signal, and a height signal of the reflecting unit 11, or a combination thereof.

In addition, the memory storage unit 133 stores the position signal, the time signal, and the control sequence signal. In an embodiment, the memory storage unit 133 delivers the control sequence signal to the tracking control unit 134. In this embodiment, the tracking control unit 134 is adapted to accept the control sequence signal to control the first moving position 122a of the receiving unit 120 moving along the first direction 122, and to control the direction of the receiving unit 120 facing the reflecting unit 110. The first rotation control unit 135 is adapted to accept the control sequence signal to control the rotation angle 152 of the support element 150. The support element 150 connects the reflecting unit 110 and the receiving unit 120, as shown in FIG. 1A or 1B. The input/output unit 136 is adapted to deliver the first feedback signal 142 of the photo sensor 140 to calibrate the direction of the receiving unit 120 facing the reflecting unit 110.

In view of the above-mentioned, the solar tracking and concentration device 100 of this embodiment predict the current position of the sun according to the position and the time thereof, and the reflecting unit 110 reflects and concentrates the sunlight 110a on the receiving unit 120. In addition, it is determined whether the direction of the receiving unit 120 facing the reflecting unit 110 is calibrated or not through the first feedback signal 142 of the photo sensor 140, such that the receiving unit 120 may be calibrated face forwards the reflecting unit 110. In this embodiment, the direction of the reflecting unit 110 facing the sun is a fixed direction, in which the direction is defined to be a normal vector on the reflecting surface of the reflecting unit 110, and the positions of the sun are different under different times.

In addition, under different times, the positions of the reflecting unit 110 concentrating the sunlight 110a are different with the change of the position of the sun. In order to make the receiving unit 120 receive the preferred intensity of the light per unit area, the receiving unit 120 is adapted to move along the first direction 122 under different times to receive the reflected and concentrated sunlight 110a. In this embodiment, the first direction 122 is a vertical direction. In another embodiment, the first direction 122 may also be a direction with an inclination angle with respect to a horizontal direction, in which the inclination angle depends on the shape of the support element.

In this embodiment, the controlling device 130 further includes a data transmission device 137, as shown in FIG. 1C. The data transmission device 137 is adapted to load the position signal to the controlling device 130. In addition, for example, the data transmission device 137 may be, but not limited to, a serial port device or a parallel port device. In another not shown embodiment, for example, the data transmission device 137 may be, but not limited to, a serial port device with wireless data transmission, for example, a plug-and-play device with blue tooth transmission or a plug-and-play device with infrared transmission.

In this embodiment, the controlling device 130 further includes a global positioning system (GPS) receiver 138a or a broadcast system receiver 138b, as shown in FIG. 1C. Particularly, the GPS receiver 138a or the broadcast system receiver 138b receives an external frequency modulation (FM) signal or a GPS broadcast signal, so as to adjust or calibrate the time signal of the RTC 131. The broadcast system receiver 138b may be an FM broadcast system receiver.

In order to make the solar tracking and concentration device 100 have a preferred tracking and concentration mechanism everyday, the actuation mechanism on that day is described in detail.

Figure 2A:
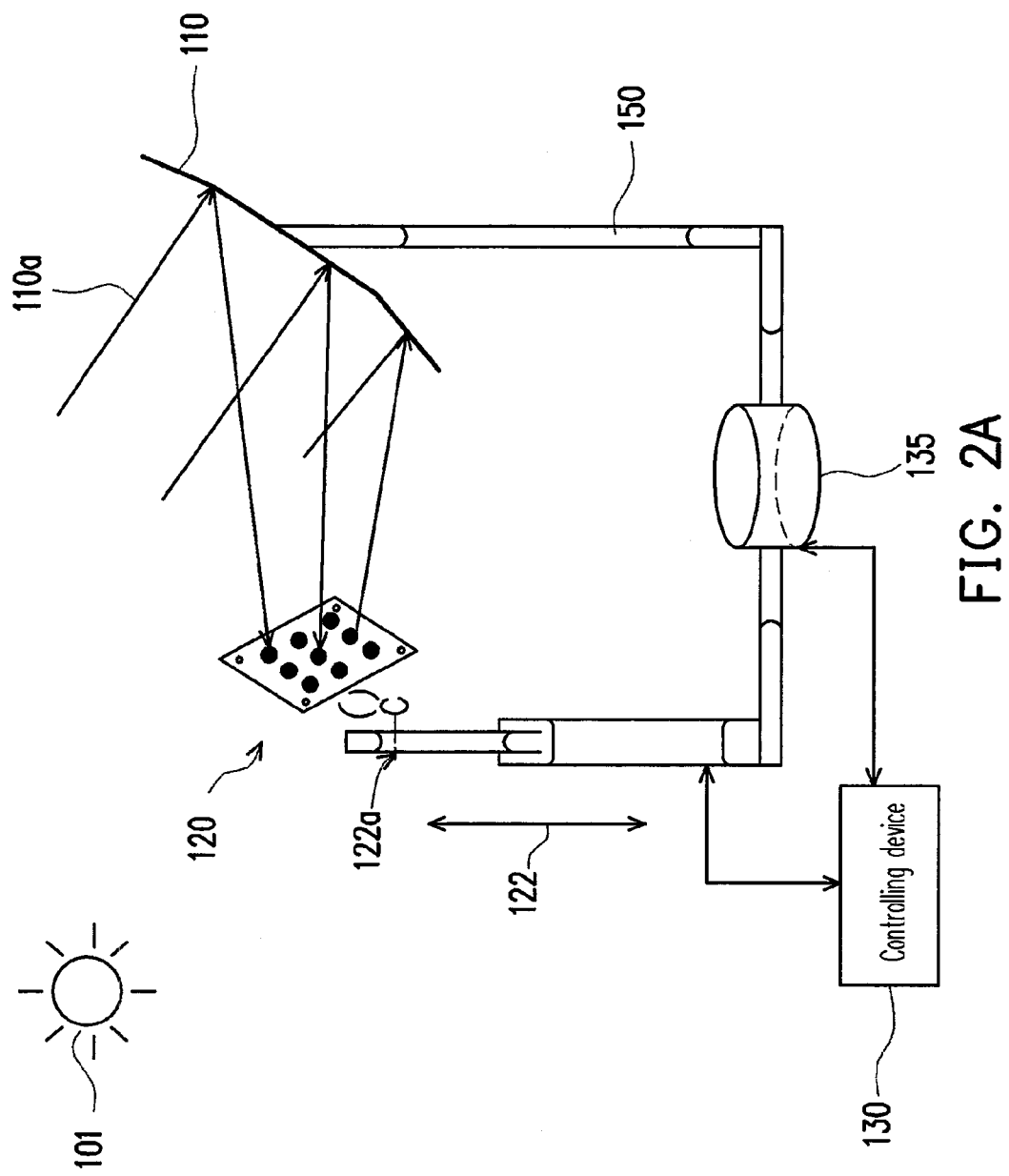
FIGS. 2A to 2C are flow charts of processes of an actuation of the solar tracking and concentration device from morning to noon.
Figure 2B:
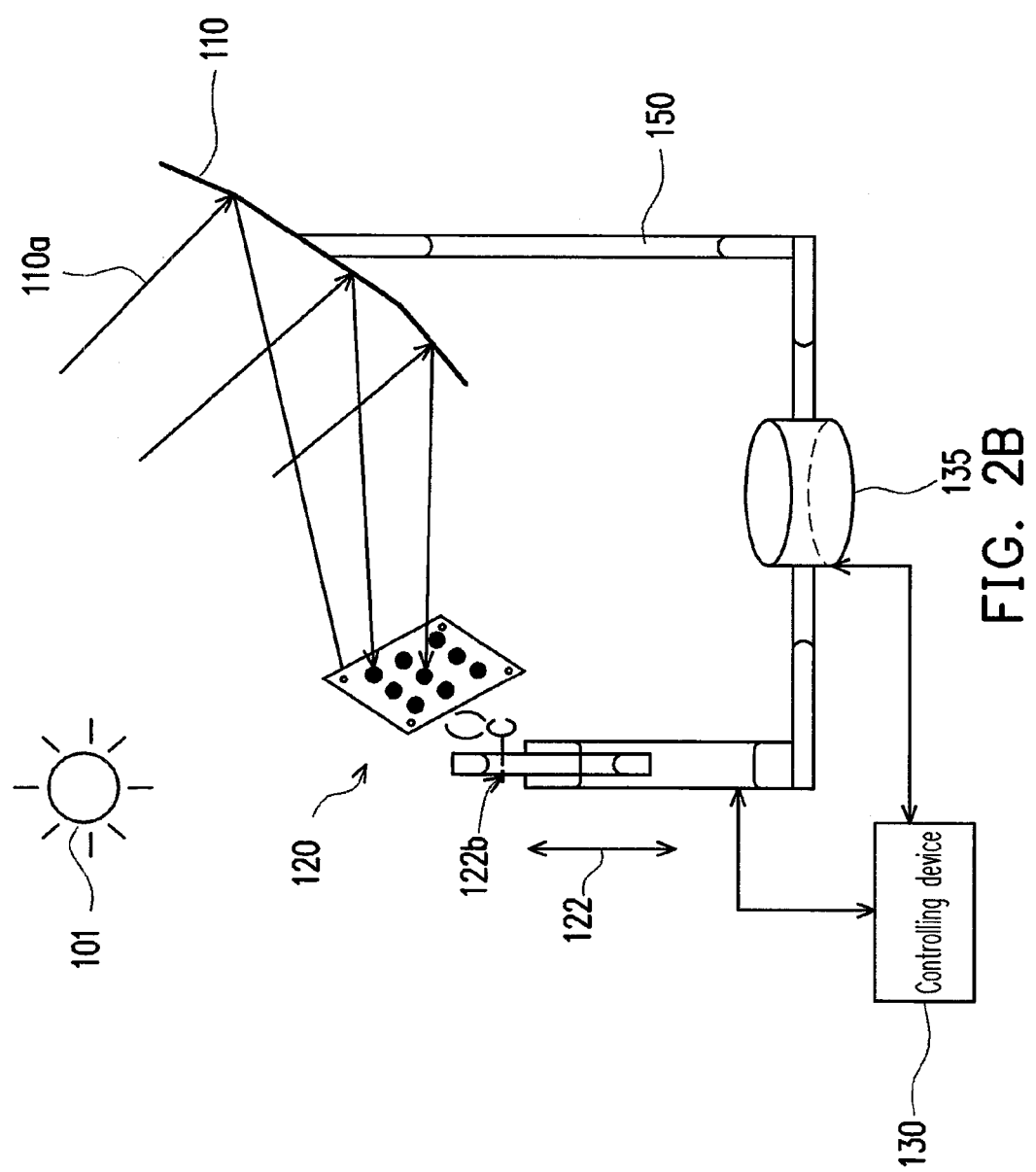
Figure 2C:
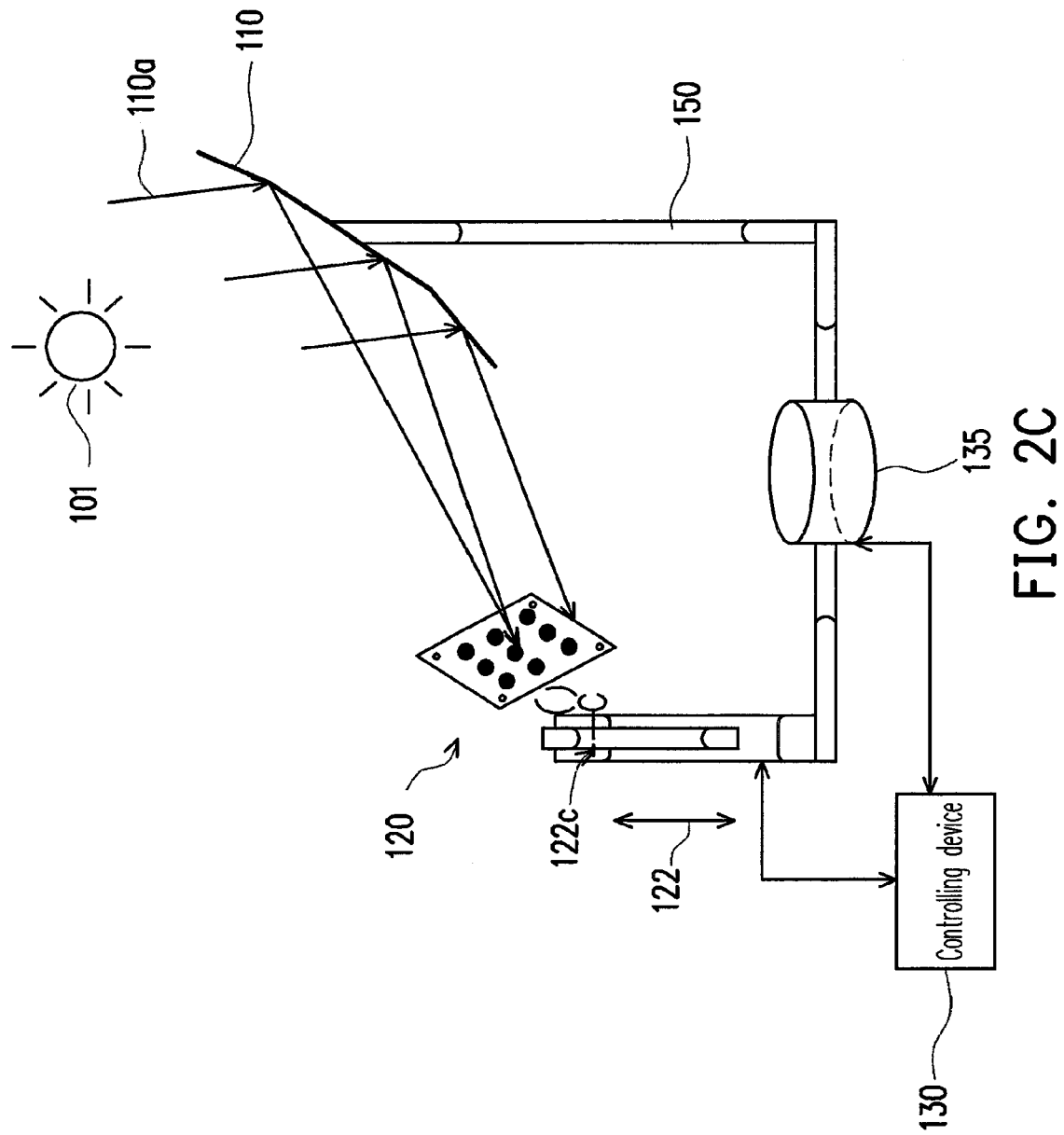

FIGS. 2A to 2C are flow charts of processes of an actuation of the solar tracking and concentration device from morning to noon. Firstly, Referring to FIG. 2A, according to the position and the time of the reflecting unit 110, the reflecting unit 110 has a direction facing the sun 101, in which the direction is a fixed direction. That is, the reflecting unit 110 is fixed on the support element 150. In addition, according to the position and the time of the reflecting unit 110, the controlling device 130 controls the receiving unit 120 to move along the first direction 122, for example, moves the receiving unit 120 to the first moving position 122a to receive the sunlight 110a reflected by the reflecting unit 110 at that time.

Next, referring to FIG. 2B, as time goes by, the position of the sun 101 slowly rises. In FIG. 2B, the direction of the reflecting unit 110 facing the sun 101 is not changed with the rise of the sun (as the reflecting unit 110 is fixed on the support element 150). Therefore, according to the optical reflection law, an incident angle (not shown) of the sunlight 110a incident to the reflecting unit 110 is changed with the time. In this manner, according to the position of the sun 101 under different times, the control unit 130 moves the receiving unit 120 to the first moving position 122b to receive the sunlight 110a reflected by the reflecting unit 110, as shown in FIG. 2B, and the first moving position 122b is lower than the first moving position 122a.

Then, referring to FIG. 2C, at noon, the sun 101 is located on the highest position on that day. Similarly, as the reflecting unit 110 is fixed on the support element 150, the receiving unit 120 is adapted to move to the first moving position 122c to receive the sunlight 110a reflected by the reflecting unit 110. The manner of moving the receiving unit 120 is controlled by the controlling device 130, and the detailed description is as the above-mentioned, so it is not repeated here. It should be noted that the first moving position 122c is lower than the first moving position 122b.

In view of the above, from morning to noon, the controlling device 130 controls the receiving unit 120 to move along the first direction 122 (that is, to move along a direction from the first moving position 122a to the first moving position 122b then to the first moving position 122c), so as to receive the sunlight 110 reflected by the reflecting unit 110 under different times. In this time period, the receiving unit 120 slowly falls as time goes by, such that receiving unit 110 may receive the preferred intensity of the light per unit area under different times. Therefore, the solar tracking and concentration device 100 has the preferred photoelectric conversion efficiency.

Figure 2D:
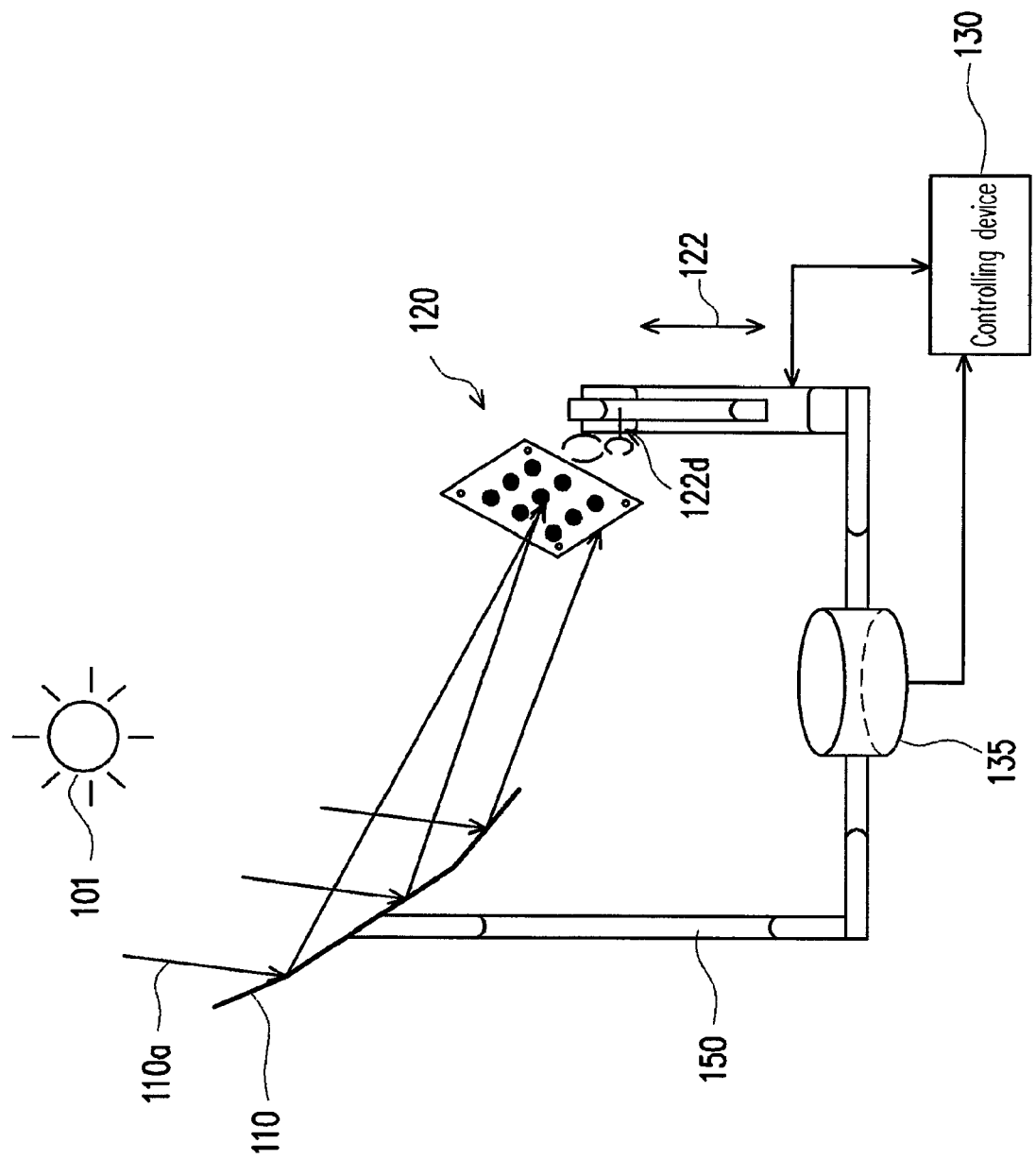
FIGS. 2D to 2E are flow charts of processes of the actuation of the solar tracking and concentration device from noon to afternoon.
Figure 2E:
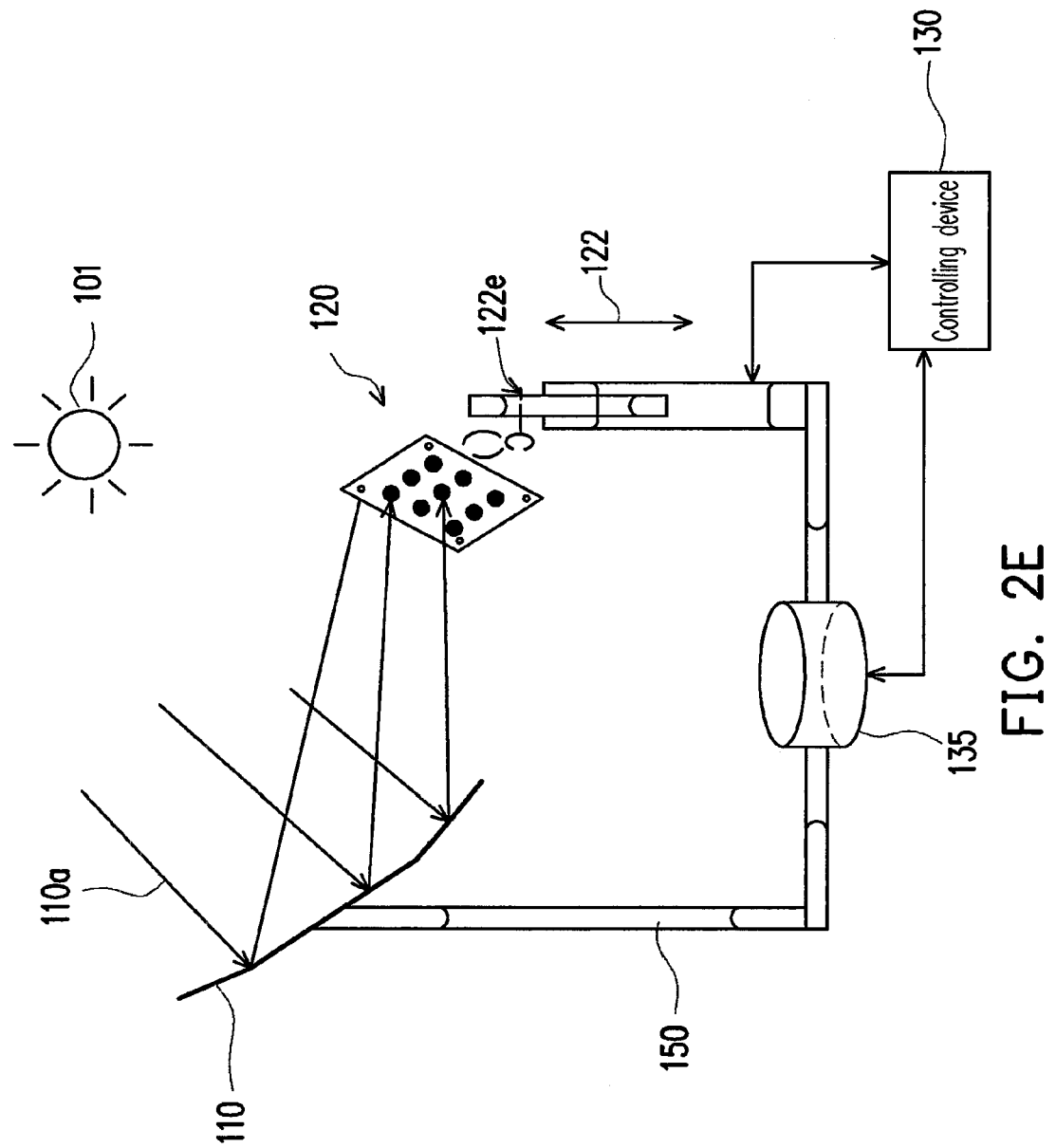

In addition, FIGS. 2D to 2E are flow charts of the actuation of the solar tracking and concentration device from noon to afternoon. In FIG. 2C, after the noon, it may be found that the sun 101 is located on the back of the reflecting unit 110, at this time, the reflecting unit 110 cannot reflect the sunlight 110a on the receiving unit 120. Therefore, the controlling device 130 is adapted to control the first rotation control unit 135 (as shown in FIG. 1A or 1B) to rotate the support element 150 connecting the reflecting unit 110 and the receiving unit 120, such that the reflecting unit 110 and the receiving unit 120 may rotate for an angle at the same time, and the reflecting unit 110 may face the sun 101 again, thereby reflecting and concentrating the sunlight 110a to the receiving unit 120. The receiving unit 120 is adapted to be controlled by the control unit 130 to move to the first moving position 122d, as shown in FIG. 2D.

Referring to FIG. 2E, when the sun slowly falls from the highest position at noon, the incident angles of the sunlight 110a incident to the reflecting unit 110 are different with the different positions of the sun, in this manner, the control unit 130 is adapted to move the receiving unit 120 to the first moving position 122e to receive the sunlight 110a reflected and concentrated by the reflecting unit 110, as shown in FIG. 2E. In other words, according to the optical reflection law, it is intuitively known that the first moving position 122e is higher than the first moving position 122d, as shown in FIGS. 2D and 2E. Therefore, from noon to afternoon, the receiving unit 120 is adapted to move along a direction from the first moving position 122d to the first moving position 122e (that is, the receiving unit 120 slowly rises), so as to receive the sunlight 110a reflected and concentrated by the reflecting unit 120 under different times.

To sum up, the solar tracking and concentration device 100 controls the receiving unit 120 to move along the first direction 122 to receive the sunlight 110a reflected by the reflecting unit 110 in the two time periods before noon and after noon on that day, and rotates the support element 150 connecting the reflecting unit 110 and the receiving unit 120 through the first rotation control unit 135. Therefore, the reflecting unit 110 may continuously reflect the sunlight 110a during different time periods and concentrate the sunlight 110a on the receiving unit 120 by only rotating the whole solar tracking and concentration device 100 once, such that the receiving unit 110 nay continuously receive the preferred intensity of the light per unit area, thereby improving the photoelectric conversion efficiency of the solar tracking and concentration device.

In addition, an inclination angle between the earth's rotation axis and the ecliptic is 23.5 degrees, such that in different seasons, the highest positions of the sun are different. For example, when the solar tracking and concentration device 100 is disposed on the position of north latitude 23.5 degrees, the sun directly irradiates on the position of north latitude 23.5 degrees in summer, so the highest position of the sun in summer is right above the solar tracking and concentration device, and the sun rises along the right east direction and falls along the right west direction. In spring and autumn, the sun directly irradiates on the equator, so the highest position of the sun in spring and autumn is lower than the highest position of the sun in summer, and the sun rises along the east by south direction and falls along the west by south direction.

Therefore, in order to make the solar tracking and concentration device 100 have the preferred tracking and concentration mechanism during the whole year, the actuation mechanisms in different seasons are described in detail as follows, in which the solar tracking and concentration device 100 is, for example, but not limited to, disposed on the position of north latitude 23.5 degrees.

Figure 3A:
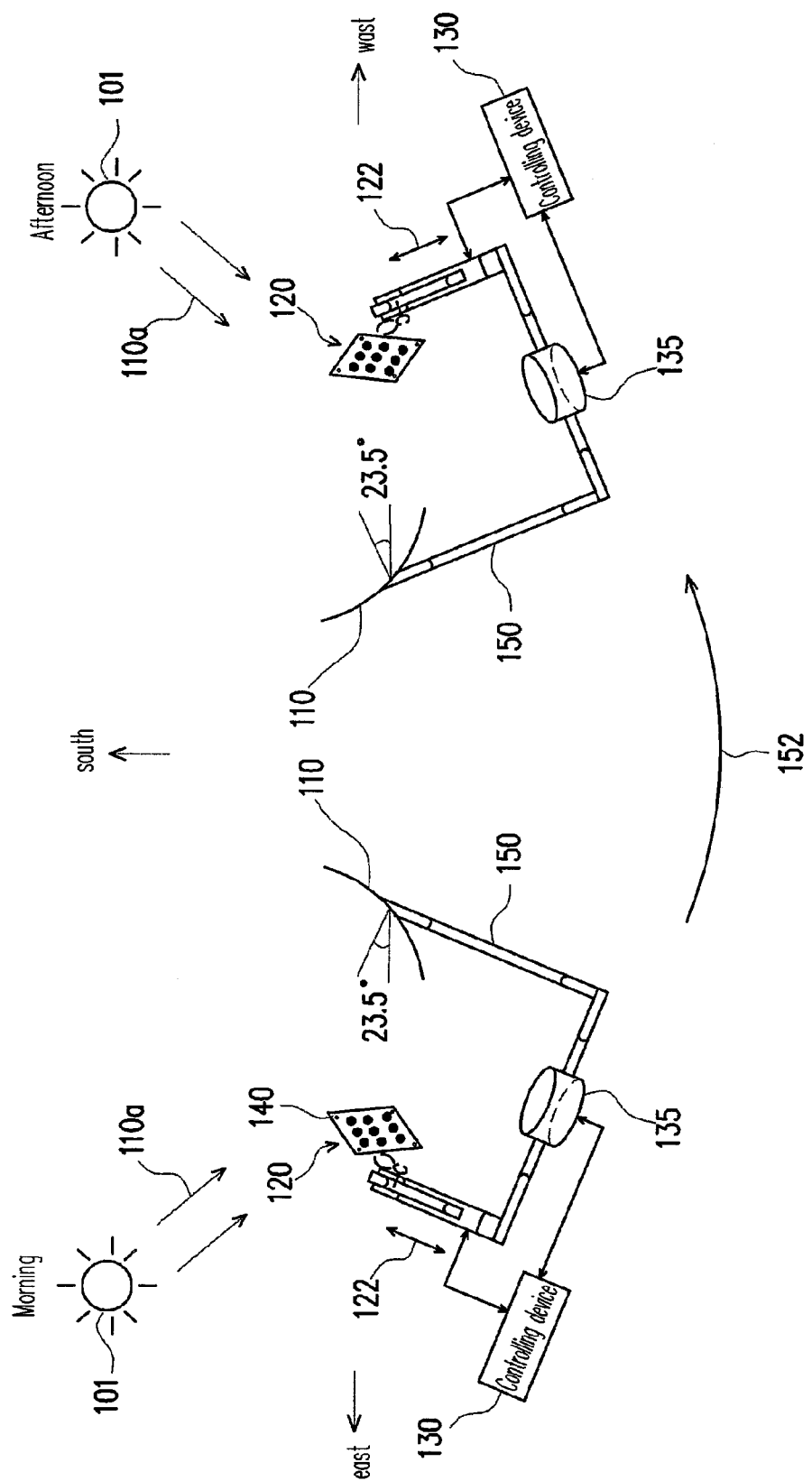
FIG. 3A is a schematic view of the actuation of the solar tracking and concentration device in spring and autumn.
Figure 3B:
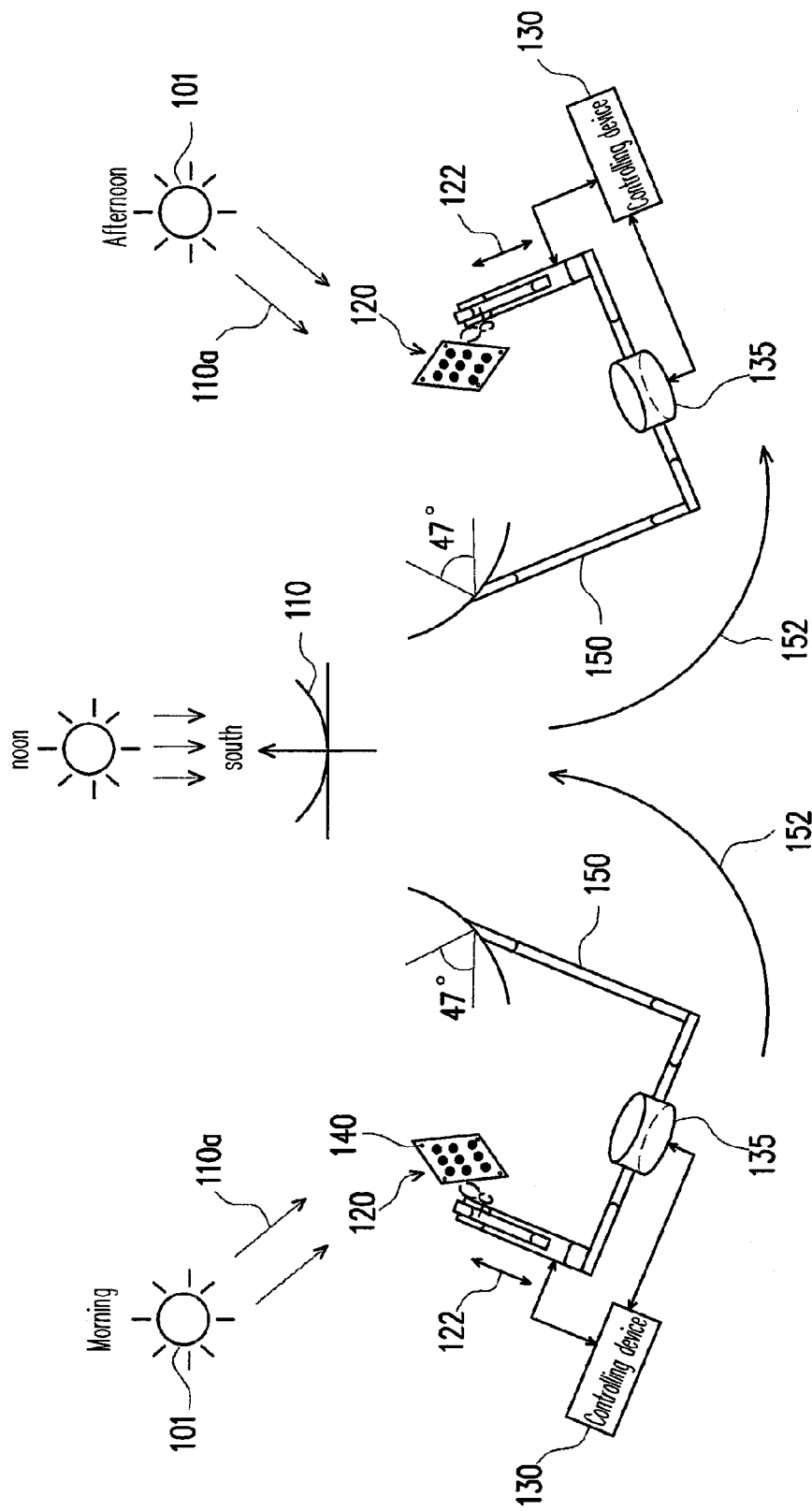
FIG. 3B is a schematic view of the actuation of the solar tracking and concentration device in winter.

FIG. 3A is a schematic view of the actuation of the solar tracking and concentration device in spring and autumn, and FIG. 3B is a schematic view of the actuation of the solar tracking and concentration device in winter. Referring to FIG. 3A, in the spring and autumn, the sun rises along the east by south direction and falls along the west by south direction. Therefore, from morning to noon, the reflecting unit 110 is adapted to face the direction of east by south 23.5 degrees. That is, the first rotation control unit 135 is adapted to rotate the support element 150 to make the reflecting unit 110 face the direction of east by south 23.5 degrees, as shown in FIG. 3A. From noon to afternoon, the first rotation control unit 135 is adapted to rotate the support element 150 to make the reflecting unit 110 face the direction of west by south 23.5 degrees, as shown in FIG. 3B, such that the sunlight 110a may be reflected to the receiving unit 120.

In addition, referring to FIG. 3B, the sun rises along the east by south direction and falls along the west by south direction in winter. Therefore, from morning to noon, the reflecting unit 110 is adapted to face the direction of east by south 47 degrees to face the sun 101. That is, the first rotation control unit 135 is adapted to rotate the support element 150 to the east by south 47 degrees to make the reflecting unit 110 face the direction of east by south 47 degrees, as shown in FIG. 3B. From noon to afternoon, the first rotation control unit 135 is adapted to rotate the support element 150 to west by south 47 degrees, that is, the reflecting unit 110 is made to face the direction of west by south 47 degrees, as shown in FIG. 3B. In winter, the sun rises and falls relatively along south, so in addition to rotating the support element 150 once to make the reflecting unit facing the east by south 47 degrees, at noon, the first rotation control unit 135 may further rotate the support element 150 to make the reflecting unit 110 face the right south, and next rotate the support element 150 to make the reflecting unit 110 face the east by south 47 degrees, as shown in FIG. 3B.

In view of the above, in addition to make the solar tracking and concentration device 100 track the sun during different time periods, the first rotation control unit 135 may further track the sun during the whole year through different rotation angles, such that the receiving unit 120 may have the preferred intensity of the light per unit year during the whole year.

It should be noted that, as an example, the solar tracking and concentration device 100 is located on the position of north latitude 23.5 degrees, so as to describe the actuation manners of the solar tracking and concentration device 100 in different seasons. However, those of ordinary skill in the art may know that the solar tracking and concentration device 100 of the present invention may be used on other latitudes and positions.

Figure 4:
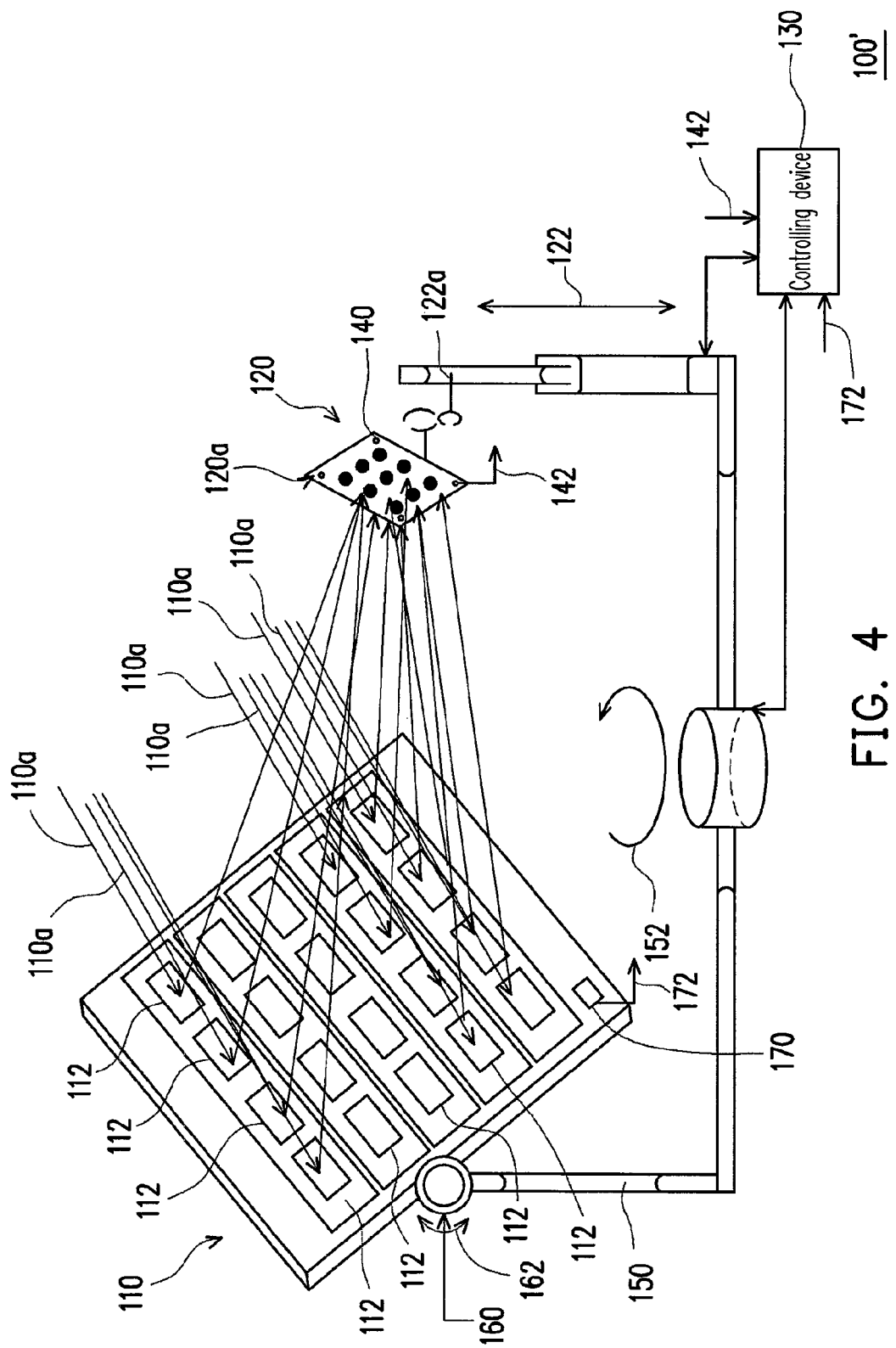
FIG. 4 is a schematic view of the solar tracking and concentration device according to another implementation aspect of the present invention.

In addition, FIG. 4 is a schematic view of the solar tracking and concentration device according to another implementation aspect of the present invention. Referring to FIG. 4, a solar tracking and concentration device 100' is similar to the solar tracking and concentration device 100, the same members are marked by the same reference numerals, and the same parts are not repeated. The difference of the two is that the controlling device further includes a second rotation control unit 160, as shown in FIG. 4. The second rotation control unit 160 is adapted to accept the control sequence signal to control the rotation angle 162 of the reflecting unit 110.

In addition, the solar tracking and concentration device 100' further includes an inclination sensing device 170, as shown in FIG. 4. The inclination sensing device 170 is disposed on the reflecting unit 110 to detect an inclination direction (not shown) of the reflecting unit 110. In addition, the inclination sensing device 170 is adapted to output a second feedback signal 172 to the controlling device 130 to calibrate the direction of the reflecting unit 110 facing the sun according to the inclination direction. That is to say, the controlling device 130 determines whether the direction of the reflecting unit 110 facing the sun controlled by the controlling device 130 is calibrated or not according to the inclination direction, and calibrates the direction.

Figure 4A:
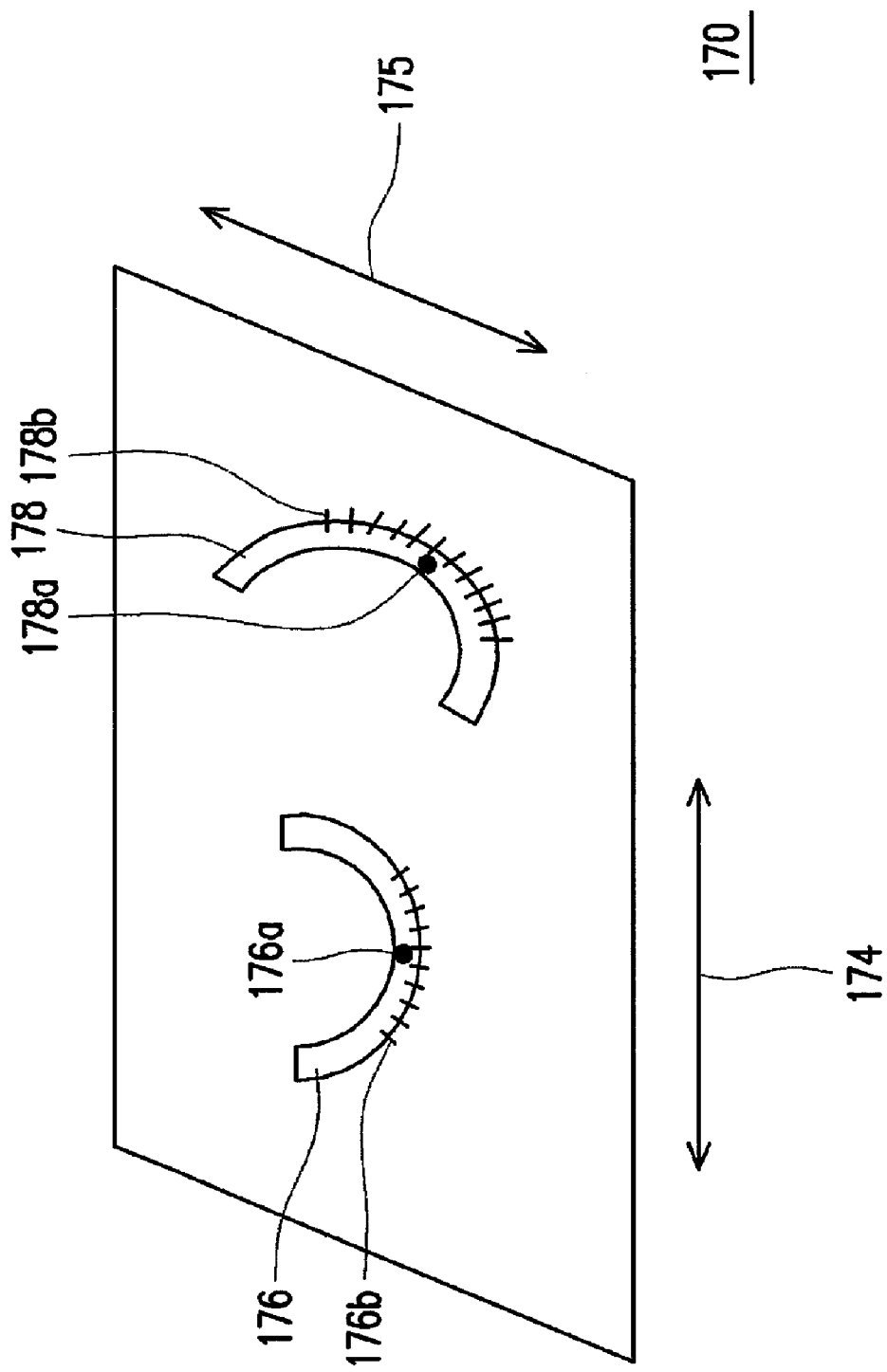
FIG. 4A is a schematic view of an inclination sensing device of FIG. 4.
Figure 4B:
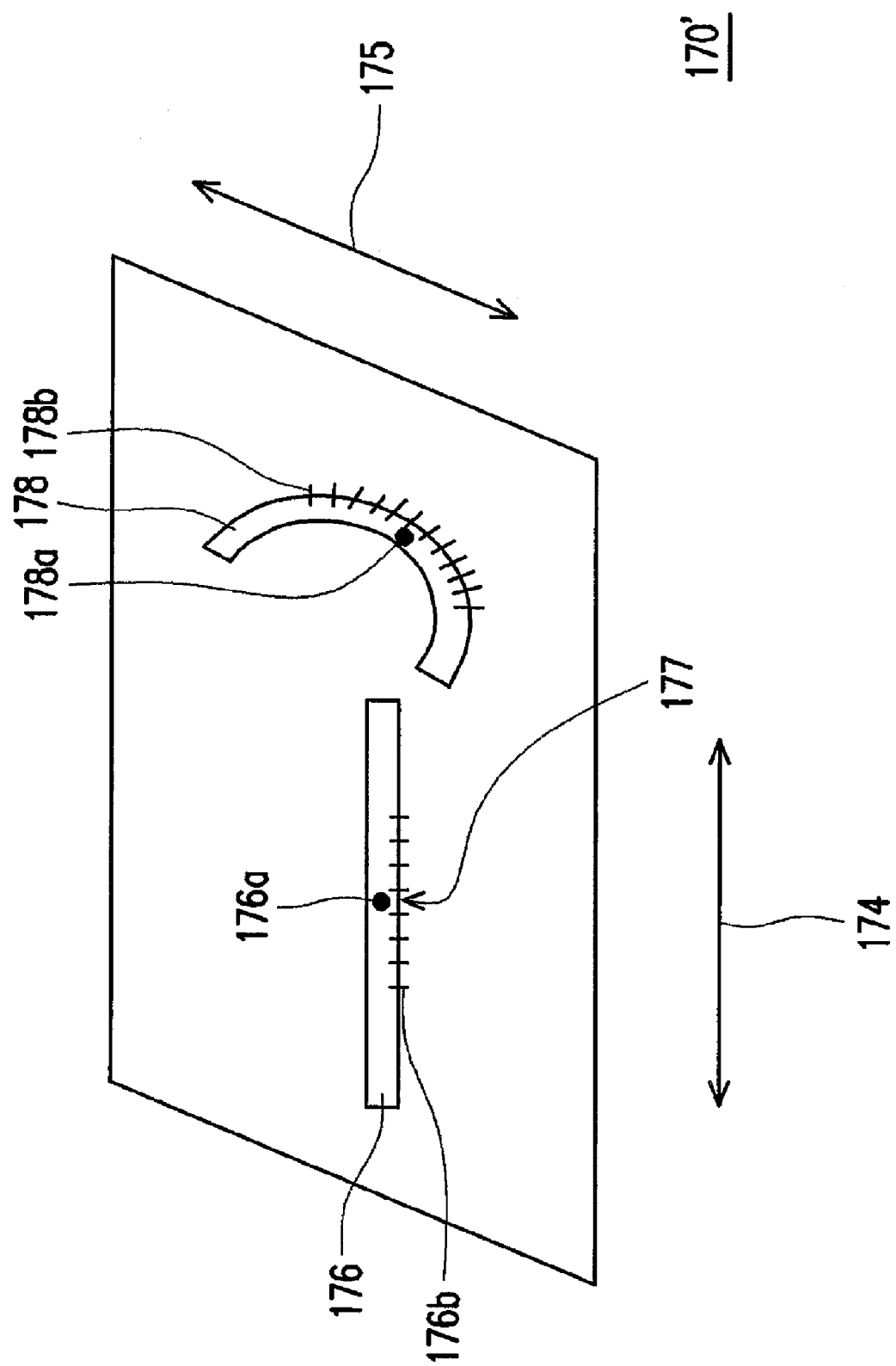
FIG. 4B is a schematic view of another inclination sensing device of FIG. 4.

FIG. 4A is a schematic view of an inclination sensing device of FIG. 4, and FIG. 4B is a schematic view of another inclination sensing device of FIG. 4. Referring to FIG. 4A, in this embodiment, the inclination sensing device 170 includes a first containing area 176 extending along a second direction 174 and a first moving member 176*a* disposed in the first containing area 176. The first moving member 176*a* moves along the second direction 174. A plurality of first sensing members 176*b* is disposed in the first containing area 176. The first sensing members 176*b* sense a second moving position of the first moving member 176*a*. In this embodiment, the shape of the first containing area 176 is an arc, and the first sensing members 176*b* are uniformly disposed in the first containing area 176, as shown in FIG. 4A. The inclination sensing device of the present invention is an example, and those skilled in the art should know that other types of inclination sensing devices may also be used in the present invention, for example, a G-sensor.

Particularly, when the reflecting unit 110 is inclined along the second direction 174, the first moving member 176*a* is affected by the earth gravity, such that the first moving member 176*a* moves in the first containing area 176, at this time, the first sensing members 176*b* are adapted to sense the second moving position of the first moving member 176*a*, so as to obtain a first inclination angle of the reflecting unit 110 along the second direction 174 by conversion. In this embodiment, the second direction 174 may be an east-to-west direction or a west-to-east direction.

In addition, the inclination sensing device 170 further includes a second containing area 178 extending along a third direction 175 and a second moving member 178*a* disposed in the second containing area 178. The second moving member 178*a* moves along the third direction 175. A plurality of second sensing members 178*b* is disposed in the second containing area 178. The second sensing members 178*b* sense a third moving position of the second moving member 178*a*. In this embodiment, the shape of the second containing area 178 is an arc, and the second sensing members 178*b* are uniformly disposed in the second containing area 178, as shown in FIG. 4A.

Particularly, when the reflecting unit 110 is inclined along the third direction 175, the second moving member 178*a* is affected by the earth gravity, such that the second moving member 178*a* moves in the second containing area 178, and the second sensing members 178*b* are adapted to sense the third moving position of the second moving member 178*a*, so as obtain a second inclination angle of the reflecting unit 110 along the third direction 175. In this embodiment, the third direction 175 may be a south-to-north direction or a north-to-south direction.

In view of the above, the inclination sensing device 170 obtains the direction of the reflecting unit 110 facing the sun according to the first inclination angle and/or the second inclination angle, so as to output the second feedback signal 172 to the controlling device 130 to determine whether the reflecting unit is calibrated face the sun or not, thereby calibrating the direction of the reflecting unit 110 facing the sun.

In another embodiment, the shape of the first containing area of the inclination sensing device may be a linear design, as shown in FIG. 4B. In this embodiment, the inclination sensing device 170' may only detect whether the reflecting unit 110 is parallel to the second direction 174 or not at noon. That is to say, when the first moving member 176*a* stops on a central position 177 of the first containing area 176, it indicates that the controlling device 130 controls the direction of the reflecting unit 110 facing the sun. On the contrary, the rotation angle 162 of the reflecting unit 110 should be adjusted to make the first moving member 176*a* locate on the central position of the first containing area 176, so as to finish the calibrating mechanism.

In this embodiment, the solar tracking and concentration device 100' similarly has the actuation mechanism of the solar tracking and concentration device 100, as the actuation mechanism of FIGS. 2A to 2E, or the actuation mechanism of FIGS. 3A to 3E. In addition, the solar tracking and concentration device 100' uses the second rotation control unit 160 to rotate the direction of the reflecting unit 110 facing the sun 101, so as to appropriately adjust the moving distance of the receiving unit 120 along the first direction 122.

For example, during the actuation process of FIGS. 2A to 2C, as the reflecting unit 110 is fixed on the support element 150, the receiving unit 120 is adapted to move along the first direction 122, for example, to move from the first moving position 122*a* to the first moving position 122*c*, along with the different positions and heights of the sun, and the related illustration is described above. However, the solar tracking and concentration device 100' has the second rotation control unit 160, such that the reflecting unit 110 is adapted to rotate on the support element 150, as shown in FIG. 4. In this manner, along with the different heights of the sun, the angle of the reflecting unit 110 is appropriately rotated to reflect the sunlight 110*a*, such that the moving distance of the receiving unit 120 along the first direction 122 may be reduced. In another embodiment, the receiving unit 120 may also not move, and only the angle of the reflecting unit 110 is rotated to reflect the sunlight 110*a* on the receiving unit 120. Definitely, for example, the height of the receiving unit moving along the first direction and the rotating angle of the reflecting unit all depend on the demand of the user, and the present invention is not limited thereto.

Figure 5:
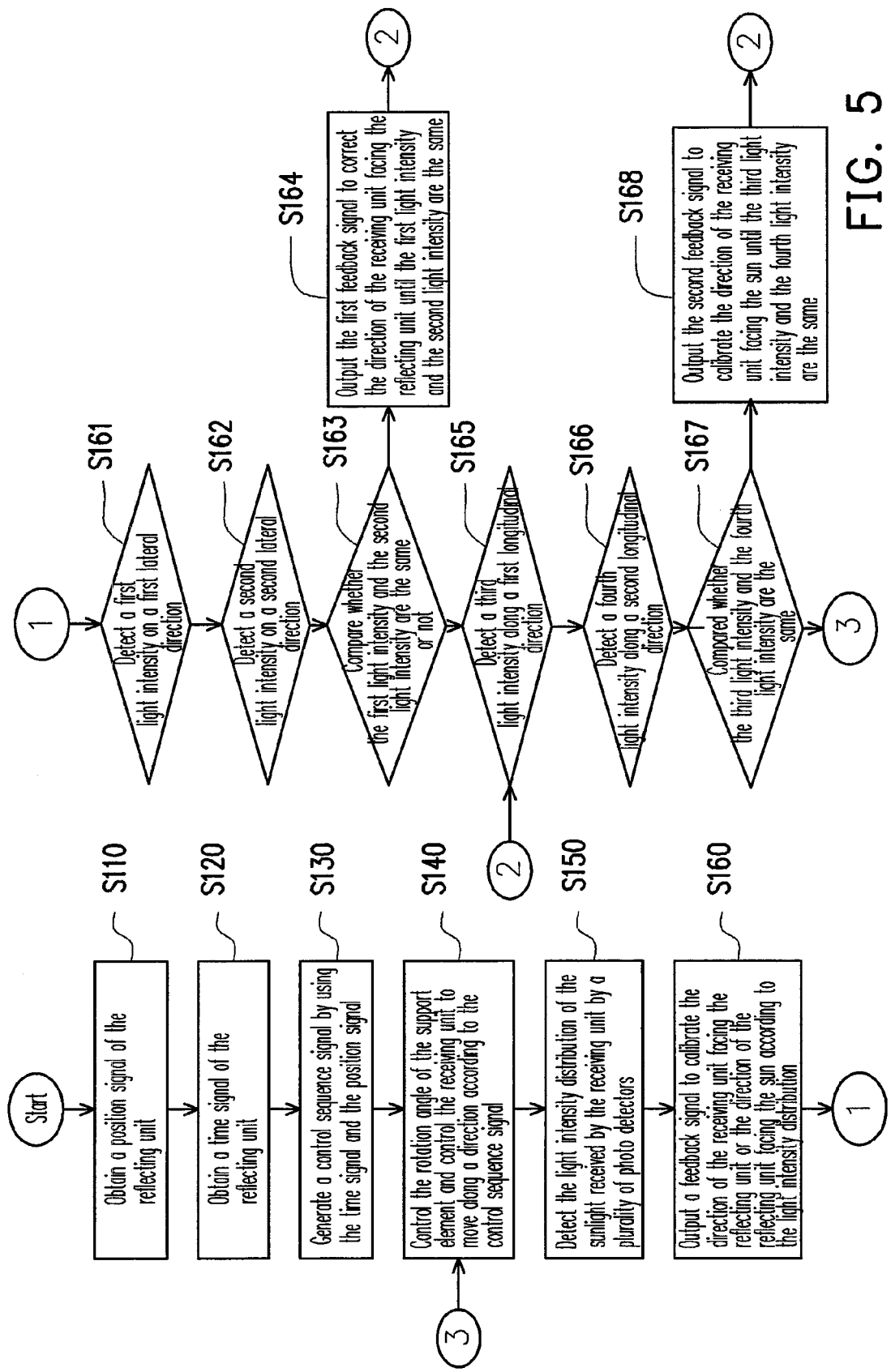
FIG. 5 is a block flow diagram of processes of a solar tracking and concentration method according to an embodiment of the present invention.

FIG. 5 is a block flow chart of a solar tracking and concentration method according to an embodiment of the present invention. Referring to FIGS. 5 and 1A, in this embodiment, the receiving unit 120 is controlled to move along a direction (for example, the first direction 122) to receive the sunlight 110*a* reflected by the reflecting unit 110. Firstly, in steps S110 and S120, a position signal and a time signal of the position and the time of the reflecting unit 110 are respectively obtained.

In this embodiment, the method of generating the position signal includes, for example, delivering the position signal by a data transmission device. The position signal includes a longitude signal, a latitude signal, and a height signal. In addition, the data transmission device may be a serial port device or a parallel port device. In addition, the method of generating the time signal includes, for example, using an RTC to generate the time signal of the reflecting unit.

Next, in step S130, a control sequence signal is generated by using the time signal and the position signal. In this embodiment, the control sequence signal is generated by, for example, an MCU. The MCU calculates the track of the sun on that day according to the time signal and the position signal of the reflecting unit.

Then, in step S140, according to the control sequence signal, the rotation angle of the support element is controlled, and the first moving position of the receiving unit moving along a direction is controlled as well, in which the support element connects the reflecting unit and the receiving unit. In this embodiment, the rotation angle of the support element is controlled by, for example, a hydraulic motor. The hydraulic motor is adapted to accept the control sequence signal to adjust the direction of the reflecting unit facing the sun. In addition, the receiving unit is controlled to move along a direction by, for example, a stepping motor. The stepping motor is adapted to accept the control sequence signal to control the receiving unit to move along a direction move and control the direction of the reflecting unit facing the sun. Definitely, the hydraulic motor and the stepping motor are described as an example, the present invention is not limited thereto, and the user may also use other appropriate manners.

Next, in step S150, a plurality of photo sensors detect the light intensity distribution of the sunlight received by the receiving unit. In this embodiment, the photo sensors are disposed on four corners of the receiving unit, and are symmetrically arranged with the center of the receiving unit as a center, as shown in FIG. 1A or 1B.

Then, in step S160, according to the light intensity distribution, a feedback signal is output to calibrate the direction of the receiving unit facing the reflecting unit or the direction of the reflecting unit facing the sun. Particularly, the process of calibrating the direction of the receiving unit facing the reflecting unit includes the following steps. Firstly, in step S161, a first light intensity of the photo sensors arranged along a first lateral direction on the receiving unit is detected. Next, in step S162, a second light intensity of the photo sensors arranged along a second lateral direction opposite to the first lateral direction on the receiving unit is detected. Then, in step 163, it is compared whether the first light intensity and the second light intensity are the same or not. In step 164, if the first light intensity is different from the second light intensity, the first feedback signal is output to the control unit to calibrate the direction of the receiving unit facing the reflecting unit until the first light intensity and the second light intensity are the same.

After finishing the above steps, next, the process of calibrating the direction of the reflecting unit facing the sun includes the following steps. Firstly, in step S165, a third light intensity of the photo sensors arranged along a first longitudinal direction on the receiving unit is detected, in which the first lateral direction is vertical to the first longitudinal direction. Next, in step S166, a fourth light intensity of the photo sensors arranged along a second longitudinal direction opposite to the first longitudinal direction on the receiving unit is detected, in which the second lateral direction is vertical to the second longitudinal direction. Then, in step 167, it is compared whether the third light intensity and the fourth light intensity are the same. In step 168, if the third light intensity is different from the fourth light intensity, the second feedback signal is output to the control unit to calibrate the direction of the receiving unit facing the sun until the third light intensity and the fourth light intensity are the same. Until now, the method applicable to the solar tracking and concentration device 100 or 100' is approximately finished.

Second Embodiment

Figure 6A:
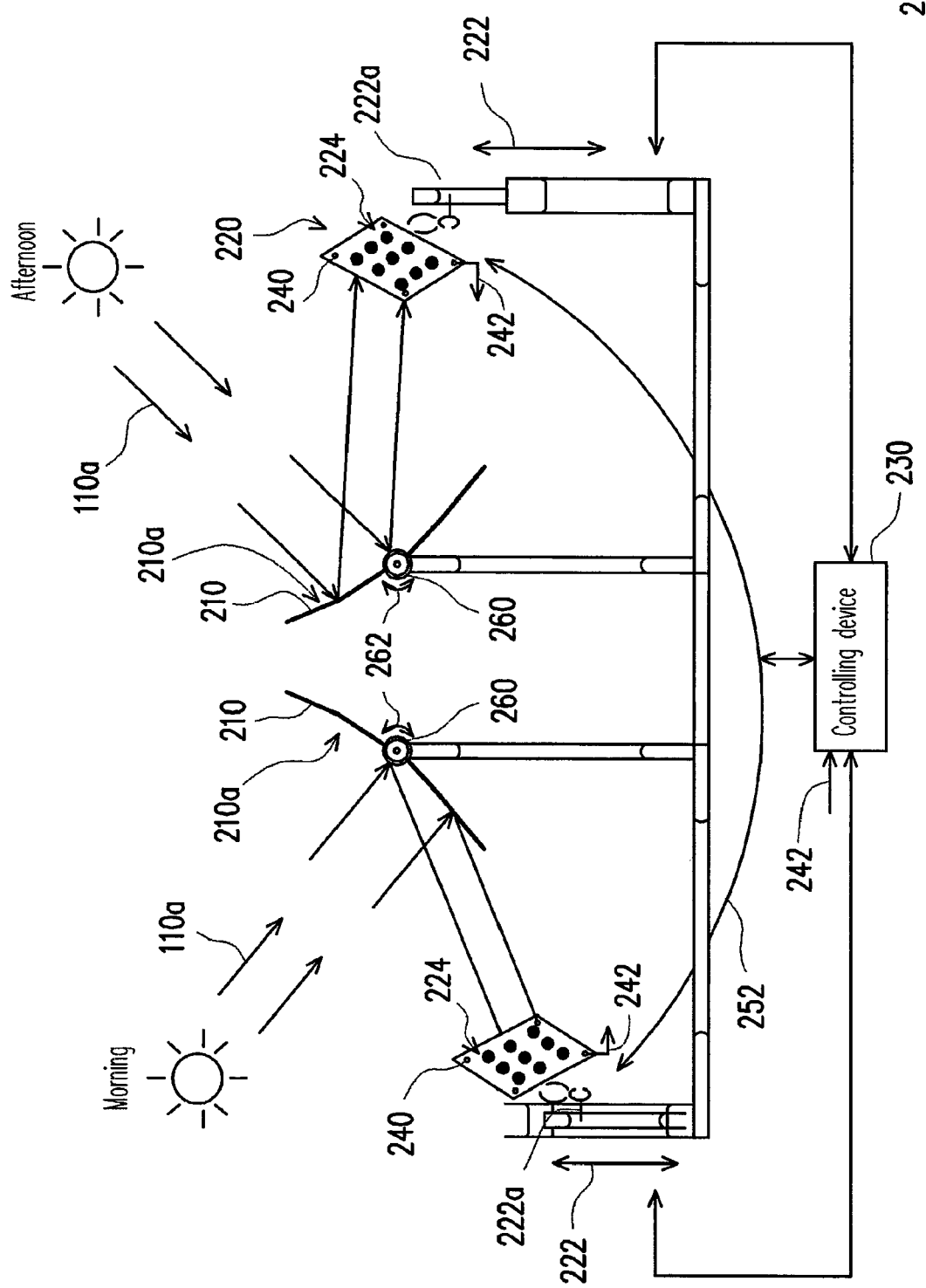
FIG. 6A is a schematic side view of the solar tracking and concentration device according to a second embodiment of the present invention.
Figure 6B:
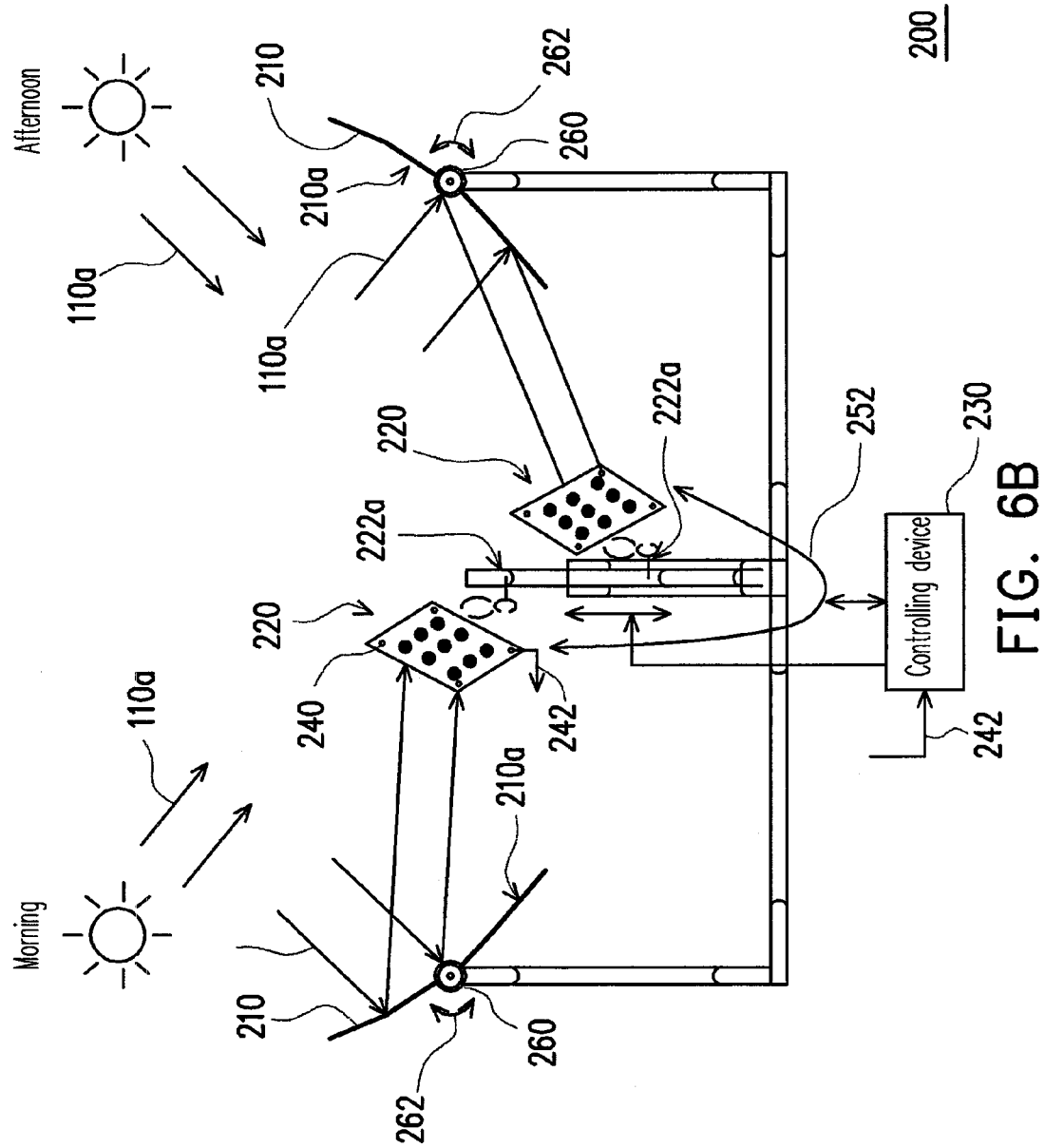
FIG. 6B is a schematic side view of the solar tracking and concentration device according to another implementation aspect.

FIG. 6A is a schematic side view of the solar tracking and concentration device according to a second embodiment of the present invention, and FIG. 6B is a schematic side view of the solar tracking and concentration device according to another embodiment. Referring to FIGS. 6A and 6B, a solar tracking and concentration device 200 or 200' includes a plurality of reflecting units 210, a receiving unit 220, a controlling device 230, and a plurality of photo sensors 240.

In this embodiment, the solar tracking and concentration device 200 or 200' adopts the concept similar to that of the solar tracking and concentration device 100 or 100', except that the structure is partially different. For example, for the identical parts, the solar tracking and concentration device 200 or 200' makes the receiving unit 220 move along the first direction 222 to receive the sunlight 110a reflected by the reflecting units 210 under different times. For the different parts, for example, the solar tracking and concentration device 200 or 200' uses a plurality of reflecting units 210 to reflect the sunlight 110a during different time periods without rotating the reflecting unit to face the sun (for example, the actuation mechanism of the solar tracking and concentration device 100), in which the different time periods are, for example, morning or afternoon, as shown in FIGS. 6A and 6B. In this embodiment, the first direction 222 is, for example, the same as the first direction 122, and the related description may be obtained with reference to the above embodiment.

In other words, the solar tracking and concentration device 200 or 200' uses the plurality of reflecting units 210 to reflect the sunlight 110a at different time periods, simultaneously moves the receiving unit 220 to the position opposite to the reflecting units 210 to receive the sunlight 110a reflected by the reflecting units 210, and controls the receiving unit 220 to move along the first direction 222 to receive the sunlight 110a reflected by the reflecting units 210 under different times during the time period, as shown in FIGS. 6A and 6B.

In the following, the connection relations of various members and the actuation mechanism of the solar tracking and concentration device 200 or 200' are described in detail, but the parts similar to those of the solar tracking and concentration device 100 are not repeated.

In this embodiment, the reflecting units 210 reflect and concentrate the sunlight 110a, in which each reflecting unit 210 has a reflecting surface 210a, as shown in FIG. 6A. Particularly, the structure and the function of the reflecting unit 210 are similar to those of the reflecting unit 110, and the related description may be obtained with reference to the above embodiment. It should be noted that the solar tracking and concentration device 200 or 200' has the plurality of reflecting units 210, and the reflecting surfaces 210a of the reflecting units 210 are disposed back to back, as shown in FIG. 6A. In another embodiment, the reflecting surfaces 210a of the reflecting units 210 are disposed face to face, as shown in FIG. 6B. In this manner, the reflecting units 210 may reflect the sunlight 110a to the receiving unit 220 during different time periods (for example, the time periods of morning and afternoon), without using the first rotation control unit 135 to rotate the reflecting unit 110. It should be noted that although the increasing of the reflecting units 210 may be helpful to reflect the sunlight 110a in different seasons, the fabricating cost is increased. Therefore, the number of the reflecting units 210 is determined according to the demand of the user, and the present invention is not limited here.

In this embodiment, the receiving unit 220 receives the sunlight 110a reflected by one of the reflecting units 210, in which the receiving unit 220 face one of the reflecting units 210 under different times, and the receiving unit 220 is adapted to move along a first direction 222, as shown in FIGS. 6A and 6B. Particularly, the structure and the function of the receiving unit 220 are similar to those of the receiving unit 120, and the related description may be obtained with reference to the above embodiment. It should be noted that under different time periods, the control unit 230 is adapted to rotate or move the position of the receiving unit 220 to make the receiving unit 220 face one of the reflecting units 210, so as to receive the sunlight 110a reflected by the reflecting unit 210 at that time, as shown in FIGS. 6A and 6B.

Similarly, in order to improve the photoelectric conversion efficiency of the solar tracking and concentration device 200 or 200', that is, to effectively reflect the sunlight on the receiving unit 220, the plurality of photo sensors 240 is disposed on the periphery 224 of the receiving unit 220, for example, corners or surrounding edges. The manner of disposing the photo sensors and the application are similar to those of the photo sensors 140. Particularly, the photo sensors detect the sunlight 110a reflected by one of the reflecting units 220 to the receiving unit 220, and are adapted to output a first feedback signal 242 to the controlling device 230 to calibrate the direction of the receiving unit 220 facing the reflecting units 220, and the more detailed description may be obtained with referent to the description of the photo sensors 140 of the above embodiment, so it is not repeated here.

Figure 6C:
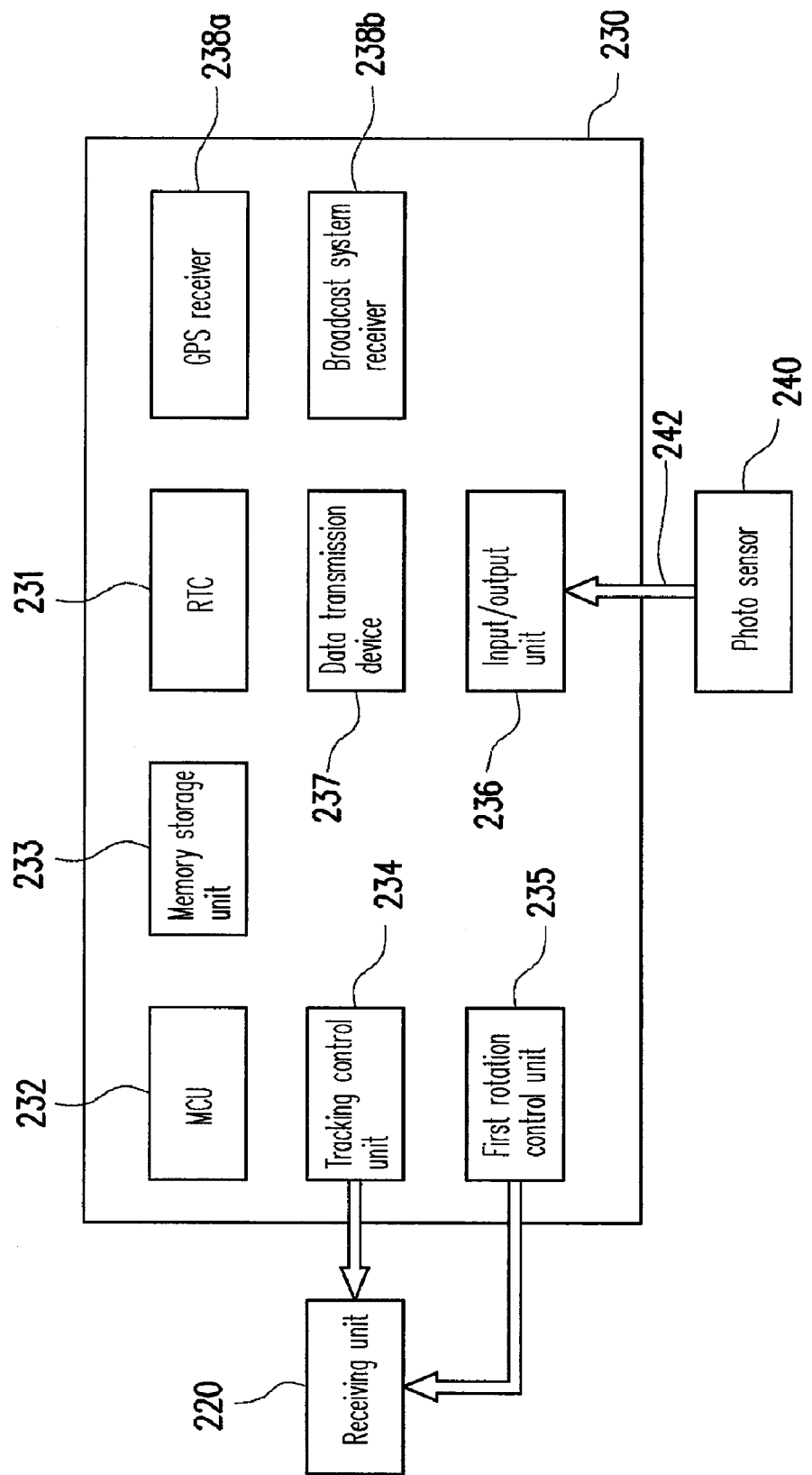
FIG. 6C is a systematic block diagram of the solar tracking and concentration device of FIG. 6A or 6B.

In addition, FIG. 6C is a systematic block diagram of the solar tracking and concentration device of FIG. 6A or 6B. Referring to FIGS. 6A, 6B, and 6C, in this embodiment, the controlling device 230 includes an RTC 231, an MCU 232, a memory storage unit 233, a tracking control unit 234, a first rotation control unit 235, and an input/output unit 236.

In this embodiment, the description of the function of various members of the controlling device 230 is similar to that of the controlling device 130, so the same parts may be obtained with reference to the description of the above embodiment, and it is not repeated here. For the different parts, the first rotation control unit 235 is adapted to accept the control sequence signal to control the rotation angle 252 of the receiving unit 220 facing one of the reflecting units 210. Particularly, the sun tracking and concentration device 100 or 100' uses the first rotation control unit 135 to rotate the rotation angle 152 of the support element 150, so as to rotate the reflecting unit 110 and the receiving unit 120 at the same time to enable the receiving unit 120 continuously receive the sunlight 110a during different time periods, and the related description may be obtained with reference to the above embodiment. The solar tracking and concentration device 200 of this embodiment uses the first rotation control unit 235 to only rotate the rotation angle 252 of the receiving unit 220 to enable the receiving unit 220 face the different reflecting units 210 during different time periods to receive the sunlight 110a, referring to FIGS. 6A, 6B, and 6C.

Similarly, the controlling device 230 further includes a data transmission device 237, as shown in FIG. 6C. In this embodiment, the data transmission device 237 is identical to the data transmission device 137, and the related description may be obtained with reference to the above embodiment, so it is not repeated here. In addition, the controlling device 230 further includes a GPS receiver 238a or a broadcast system receiver 238b, as shown in FIG. 6C. In this embodiment, the GPS receiver 238a or the broadcast system receiver 238b is the same as the GPS receiver 138a or the broadcast system receiver 138b, and the related description may be obtained with reference to the above embodiment, so it is not repeated here.

In addition, the solar tracking and concentration device 200 or 200' of this embodiment adopts the concept similar to that of the solar tracking and concentration device 100 or 100', so the actuation mechanism of FIGS. 2A to 2E may be used to describe the actuation mechanism of the solar tracking and concentration device 200 and 200' everyday, except that it is only necessary to rotate the receiving unit 220 to face the reflecting unit, on which the sun irradiates at that time, so as to receive the sunlight, and the related description may be obtained with reference to the above embodiment, so it is not repeated here.

Likewise, the actuation mechanism in different seasons of FIGS. 3A and 3B may also be used to describe the actuation mechanism of the solar tracking and concentration device 200 or 200' in different seasons, which may be known by those of ordinary skill in the art with reference to the above related description, so it is not repeated here.

In addition, the controlling device 230 further includes a second rotation control unit 260, as shown in FIGS. 6A and 6B. In this embodiment, the second rotation control unit 260 is the same as the second rotation control unit 160, and the related description may be obtained with reference to the above embodiment, so it is not repeated here. In this manner, the solar tracking and concentration device 200 or 200' may also have the advantages of the solar tracking and concentration device 100'.

It should be noted that if the solar tracking and concentration device 200 or 200' uses the second rotation control unit 260 to control the rotation angle of the reflecting unit 210, at this time, the solar tracking and concentration device 200 or 200' further includes an inclination sensing device (not shown). The inclination sensing device is disposed on the reflecting unit 210, and is adapted to output a second feedback signal (not shown) to calibrate the direction of the reflecting unit 210 facing the sun. In this embodiment, the inclination sensing device is, for example, the inclination sensing device 170 or 170', the related description may be obtained with reference to the above embodiment, so it is not repeated here.

It should be noted that the solar tracking and concentration method in the above embodiment may also be used by the solar tracking and concentration device 200 or 200' of this embodiment, except that in step S140, in this embodiment, the rotation angle of the receiving unit facing one of the reflecting units is controlled according to the control sequence signal, and the receiving unit is controlled to move along a direction, and other steps are similar to that of the above embodiment, so will not be repeated here.

Third Embodiment

Figure 7A:
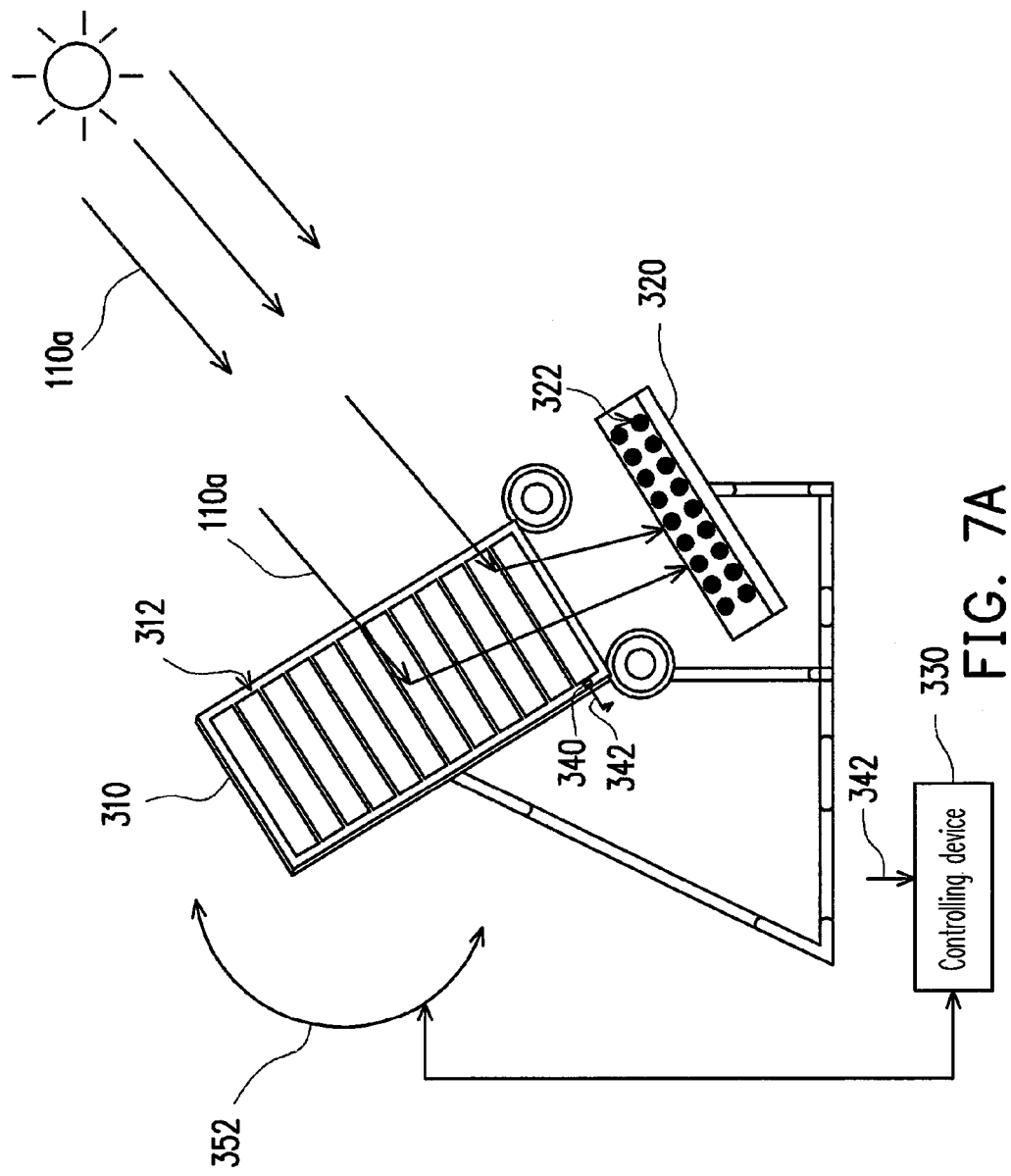
FIG. 7A is a schematic side view of the solar tracking and concentration device according to a third embodiment of the present invention.
Figure 7B:
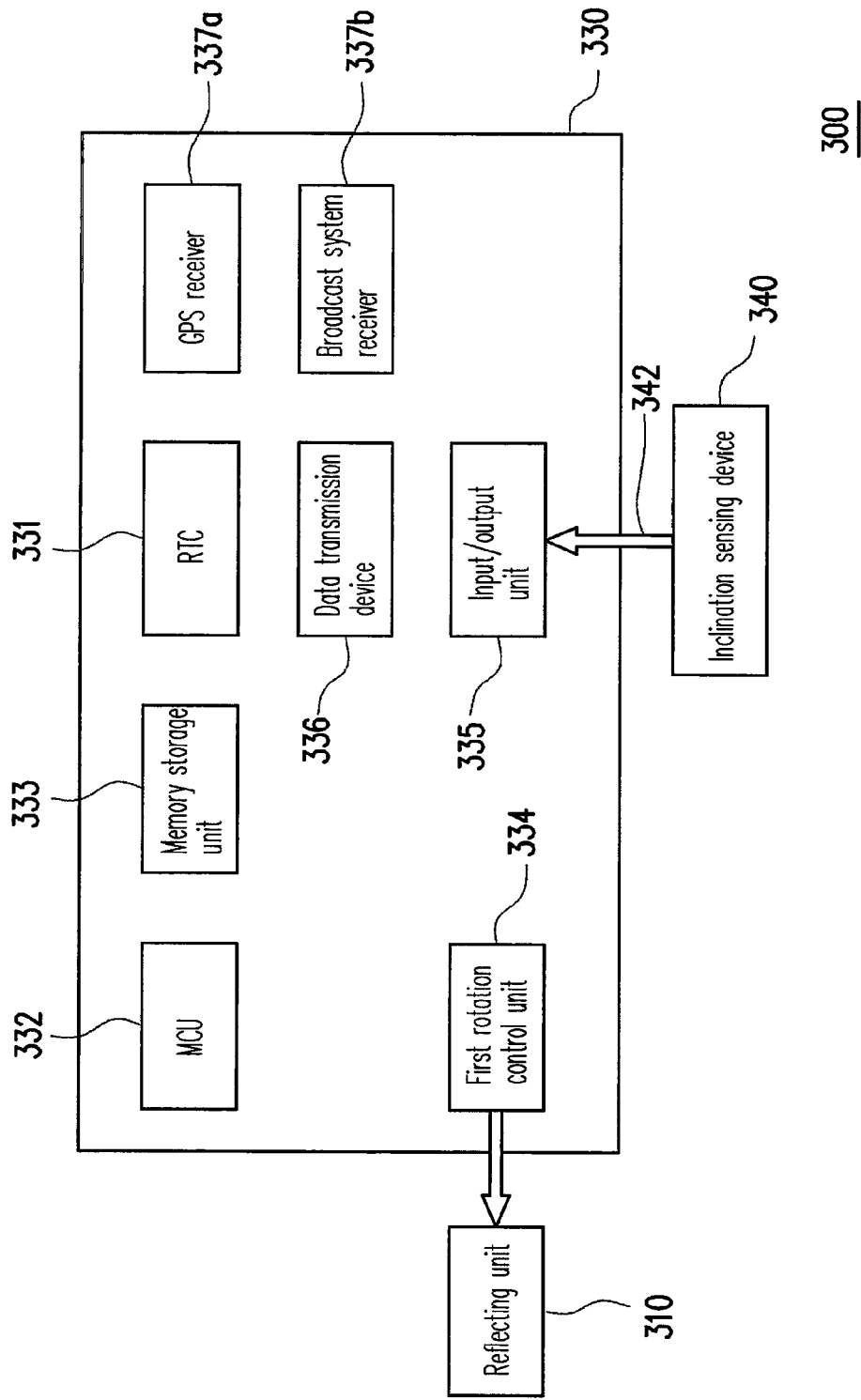
FIG. 7B is a systematic block diagram of the solar tracking and concentration device of FIG. 7A.

FIG. 7A is a schematic side view of the solar tracking and concentration device according to a third embodiment of the present invention, and FIG. 7B is a systematic block diagram of the solar tracking and concentration device of FIG. 7A. Referring to FIGS. 7A and 7B, a solar tracking and concentration device 300 of this embodiment includes a reflecting unit 310, a receiving unit 320, a controlling device 330, and an inclination sensing device 340.

In this embodiment, the reflecting unit 310 reflects and concentrates the sunlight 110a, and the reflecting unit 310 has a reflecting surface 312. Particularly, the reflecting unit 310 is, for example, the reflecting unit 110 or 210, and the related description may be obtained with reference to the above embodiment, so it is not repeated here.

In addition, the receiving unit 320 receives the sunlight 110a reflected by the reflecting unit 310, the receiving unit 320 has a receiving surface 322, and the receiving surface 322 faces the reflecting surface 312, as shown in FIG. 7A. In this embodiment, the receiving unit 320 is, for example, the receiving unit 120 or 220, and the related description may be obtained with reference to the above embodiment, so it is not repeated here.

In this embodiment, the inclination sensing device 340 is disposed on the reflecting unit 310 to detect the inclination direction of the reflecting unit 310, and the inclination sensing device 340 is adapted to output a first feedback signal 342 to the controlling device 330 to calibrate the direction of the reflecting unit 310 facing the sun, as shown in FIGS. 7A and 7B. For example, the inclination sensing device 340 is, for example, the inclination sensing device 170 or 170', and the related description may be obtained with reference to the above embodiment, so it is not repeated here.

In this embodiment, the controlling device 330 controls the rotation angle 352 of the reflecting unit 310 according to the position and the time of the reflecting unit 310, such that the reflecting unit 310 is adapted to effectively reflect the sunlight 110a to the receiving unit 320, as shown in FIG. 7A.

Particularly, the controlling device 330 includes an RTC 331, an MCU 332, a memory storage unit 333, a first rotation control unit 334, and an input/output unit 335, as shown in FIG. 7B. In this embodiment, the RTC 331, the MCU 332, and the memory storage unit 333 are, for example, the RTC 131 or 231, the MCU 132 or 232, and the memory storage unit 133 or 233, and the related description may be obtained with reference to the above embodiment, so it is not repeated here.

In addition, the first rotation control unit 334 is adapted to accept the control sequence signal to control the rotation angle 352 of the reflecting unit 310 to enable the reflecting unit 310 reflect the sunlight 110a to the receiving unit 320, as shown in FIGS. 7A and 7B. In addition, the input/output unit 335 is adapted to deliver the first feedback signal 342 of the inclination sensing device 340 to calibrate the direction of the reflecting unit 310 facing the sun, as shown in FIGS. 7A and 7B.

In this embodiment, the controlling device 330 may further includes a data transmission device 336, as shown in FIG. 7B. In this embodiment, the data transmission device 336 is, for example, the data transmission device 137 or 237, and the related description may be obtained with reference to the above embodiment, so it is not repeated here. In addition, the controlling device 330 further includes a GPS receiver 337a or a broadcast system receiver 337b, as shown in FIG. 7B. In this embodiment, the GPS receiver 337a or the broadcast system receiver 337b is the same as the GPS receiver 138a or 238a or the broadcast system receiver 138b or 238b, and the related description may be obtained with reference to the above embodiment, so it is not repeated here.

In addition, the solar tracking and concentration device 300 of this embodiment is adapted to be used in a high latitude region (for example, the latitude is larger than 23.5 degrees), and the reflecting surface of the reflecting unit 310 is made to face south or north, in which the south or north direction depends on whether the solar tracking and concentration device 300 is disposed on the north latitude or the south latitude. For example, when the solar tracking and concentration device 300 is disposed on north latitude 55 degrees, the reflecting unit 310 is adapted to face the south, so as to reflect the sunlight 110a to the receiving unit 320. On the contrary, when the solar tracking and concentration device 300 is disposed on south latitude 55 degrees, the reflecting unit 310 is adapted to face the north. It should be noted that the latitude of 55 degrees is only an example, and the present invention is not limited here.

Figure 8B:
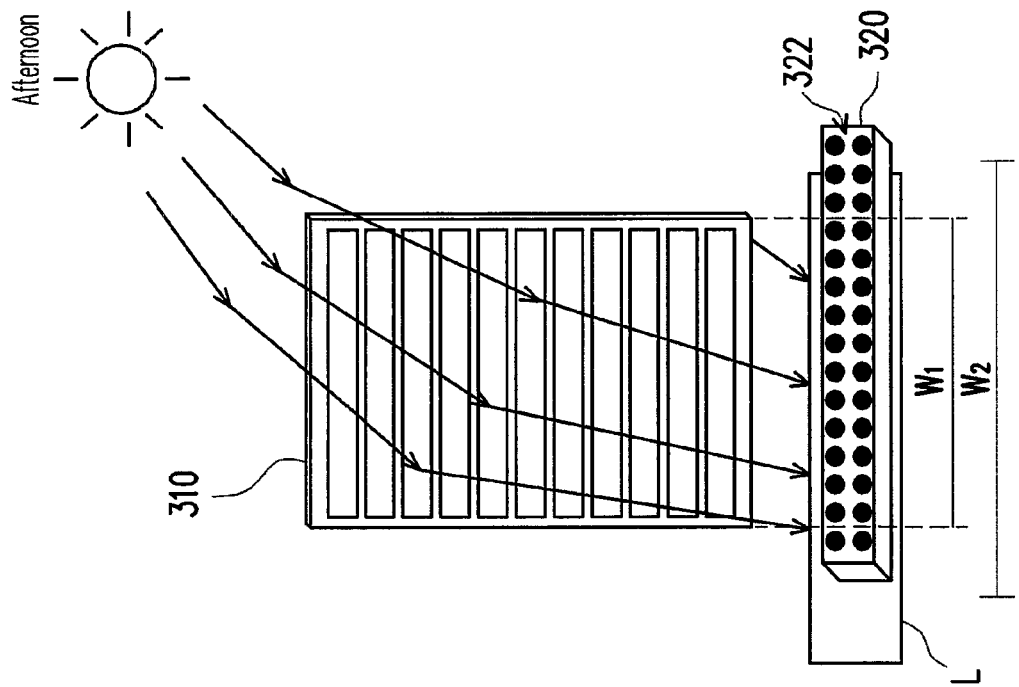
FIG. 8B is a schematic view in which the reflecting unit reflects the sunlight to the receiving unit in an afternoon time period.
Figure 8A:
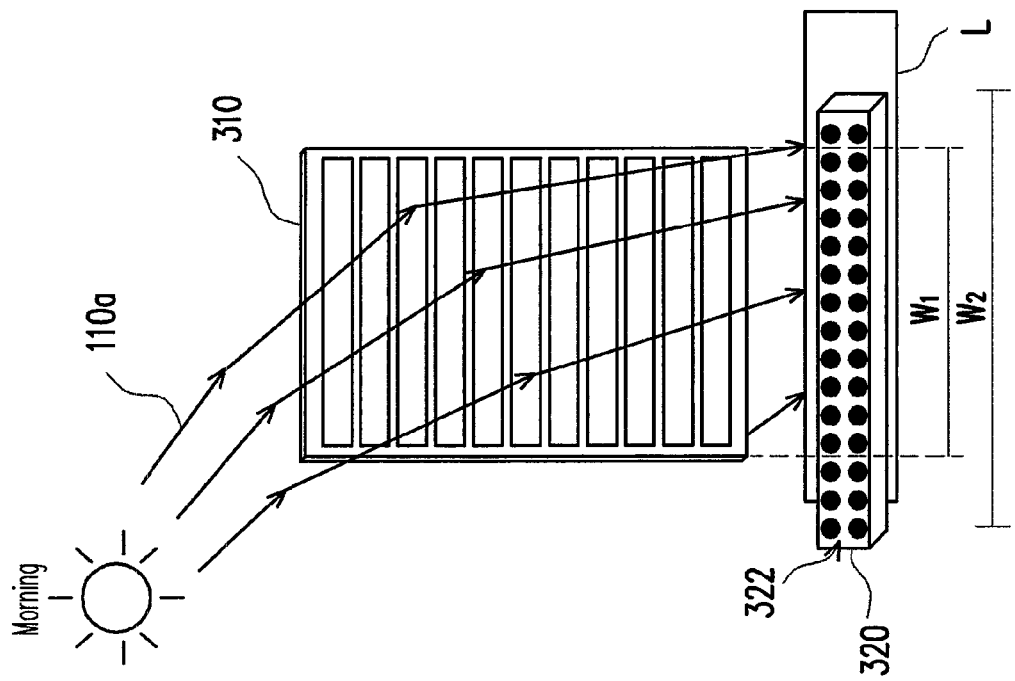
FIG. 8A is a schematic view in which the reflecting unit reflects the sunlight to the receiving unit in a morning time period.

In the following, FIGS. 8A and 8B are used to describe the actuation mechanism of the solar tracking and concentration device 300 of this embodiment, in which FIG. 8A is a schematic view in which the reflecting unit reflects the sunlight to the receiving unit in a morning time period, and FIG. 8B is a schematic view in which the reflecting unit reflects the sunlight to the receiving unit in an afternoon time period.

Referring to FIGS. 8A and 8B, the solar tracking and concentration device 300 is disposed on the high latitude region, so under different time periods, a moving direction of a light irradiation area L of the sunlight reflected to the receiving unit 320 is approximately the same with the moving direction of the sun. For example, from morning to noon, the light irradiation area L of the sunlight 110a reflected by the reflecting unit 310 to the receiving unit 320 is located on the right side of the receiving unit 320, and moves towards the left side as the time approaches noon. After the noon, the light irradiation area L reflected to the receiving unit 320 slowly appears on the left side, and gradually moves towards the left side as time goes by, as shown in FIGS. 8A to 8B. In this embodiment, a ratio of a width W1 of the reflecting unit 310 and a width W2 of the receiving unit 320 is appropriately adjusted to increase the light irradiation area L irradiating to the receiving unit 320, thereby improving the total photoelectric conversion efficiency, in which the ratio of the width W1 of the reflecting unit 310 and the width W2 of the receiving unit 320 depends on the demand of the user, and the present invention is not limited here. It should be noted that if the solar tracking and concentration device 300 is disposed on the higher latitude, the moving amplitude of the light irradiation area reflected to the receiving unit is lower, so as to reduce the light irradiation area which is not received by the receiving unit, thus having the preferred photoelectric conversion efficiency.

In addition, in the following, FIGS. 8C to 8E are used to describe the actuation mechanism of the solar tracking and concentration device in different seasons, in which FIG. 8C is a schematic view in which the reflecting unit reflects the sunlight to the receiving unit at summer noon, and FIGS. 8D and 8E are schematic flow charts in which the rotation angle of the reflecting unit is adjusted to reflect the sunlight to the receiving unit at winter noon.

Firstly, referring to FIG. 8C, at noon, the solar tracking and concentration device 300 is disposed on the high latitude, so the sun is located on a south or north direction to the right above position of the reflecting unit 310, in which the south or the north depends on whether the solar tracking and concentration device 300 is located on the north latitude or the south latitude. In FIG. 8C, the reflecting unit 310 calibrated reflects the sunlight 110a to the receiving unit 320, as shown in FIG. 8C. Next, referring to FIG. 8D, in winter, if the relative position of the reflecting unit 310 and the receiving unit 320 is as the design in summer and remains unchanged, at this time, the sun is located on the south or north direction to the right above position of the reflecting unit 310, that is, the zenith position of the sun at noon is lower, in this manner, the position on which the reflecting unit 310 reflects the sunlight 110a to the receiving unit 320 may generate an offset, such that the receiving unit 320 may not effectively receive the reflected sunlight 110a, as shown in FIG. 8D. Therefore, the solar tracking and concentration device 300 is adapted to use the first rotation control unit 334 to rotate the reflecting unit 310 to enable the reflected sunlight irradiate on the receiving unit, as shown in FIG. 8E. It should be noted that the rotation direction of the reflecting unit is, for example, the south-to-north direction or the north-to-south direction.

To sum up, in the solar tracking and concentration device 300, the reflecting unit is rotated to calibrate the position on which the reflecting unit reflects the sunlight to the receiving unit in four seasons, such that the receiving unit may receive the preferred light irradiation intensity at any moment. In addition, the solar tracking and concentration device is disposed on the high latitude region, so as to obtain the preferred light utilization rate without rotating any means on that day. In other words, the solar tracking and concentration device has the relatively simpler actuation mechanism, the relatively lower fabricating cost, and the better photoelectric utilization rate.

Fourth Embodiment

Figure 9B:
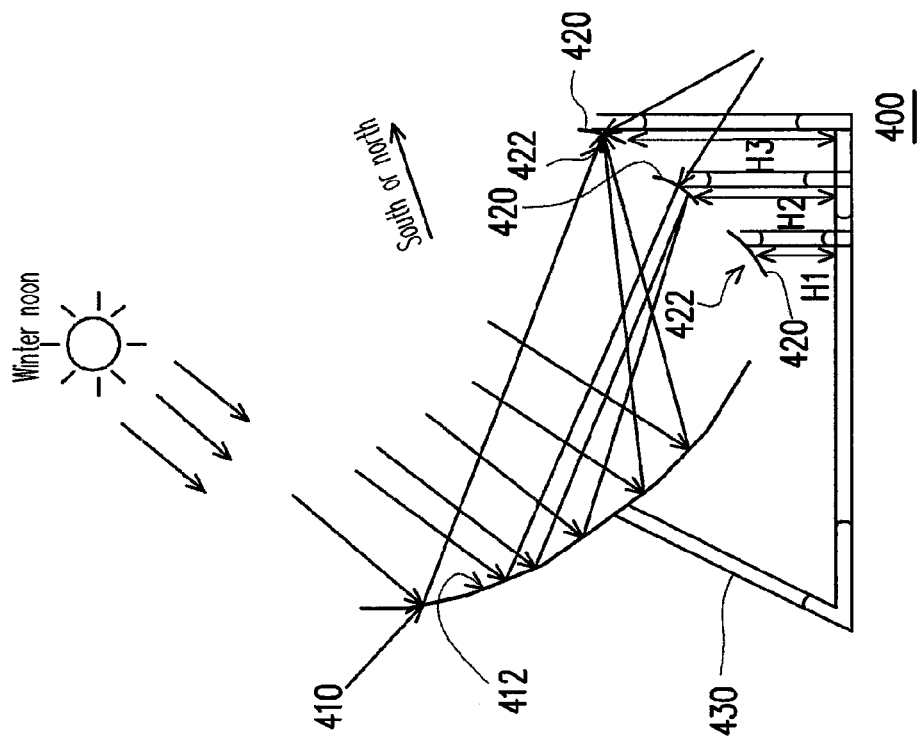
FIG. 9B is a schematic view in which the solar concentration device reflects the sunlight at winter noon.
Figure 9A:
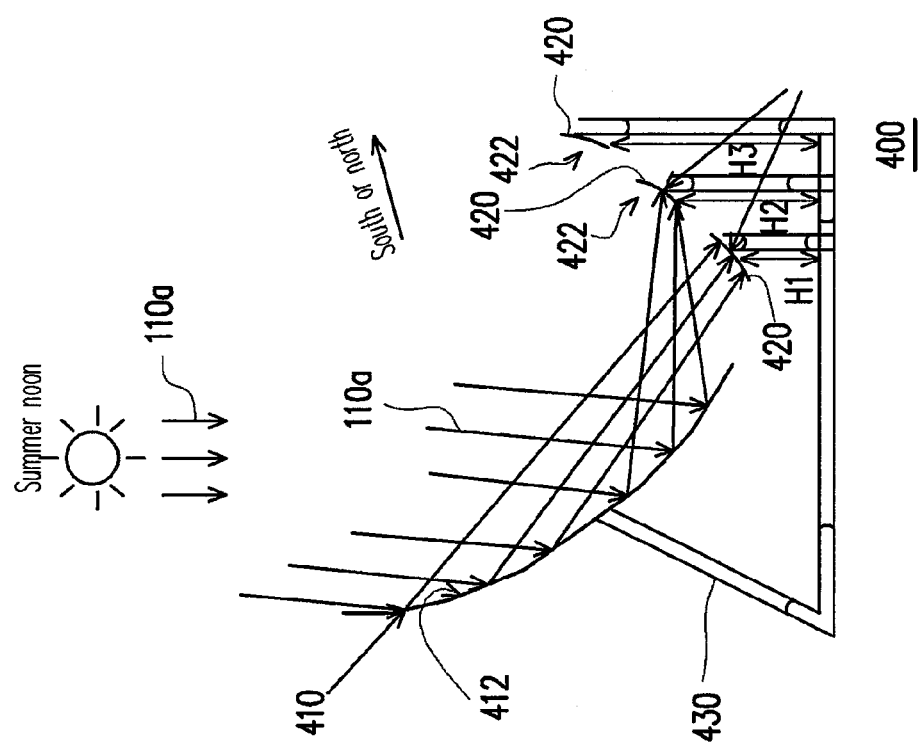
FIG. 9A is a schematic view in which a solar concentration device reflects the sunlight at summer noon.

FIG. 9A is a schematic view in which a solar concentration device reflects the sunlight at summer noon, and FIG. 9B is a schematic view in which the solar concentration device reflects the sunlight at winter noon. Referring to FIGS. 9A and 9B, a solar concentration device 400 of this embodiment includes a reflecting unit 410, a plurality of receiving units 420, and a support element 430.

In this embodiment, the reflecting unit 410 is used to reflect and concentrate the sunlight 110a, and the reflecting unit 410 has a reflecting surface 412, as shown in FIG. 9A or 9B. Particularly, the reflecting unit 410 is, for example, the reflecting unit 110, 210, or 310, and the related description may be obtained with reference to the above embodiment, so it is not repeated here.

In this embodiment, the receiving units 420 each have different heights H1, H2, and H3 to respectively receive the sunlight 110a reflected by the reflecting unit 410 under different times (summer or winter as shown in FIGS. 9A and 9B). In addition, the receiving unit 420 has a receiving surface 422, and the receiving surface 422 faces the reflecting surface 412, as shown in FIG. 9A or 9B. Particularly, the receiving unit is, for example, the receiving unit 120, 220, and 320, and the related description may be obtained with reference to the above embodiment, so it is not repeated here.

In this embodiment, the support element 430 supports the reflecting unit 410 and the receiving unit 420, as shown in FIGS. 9A and 9B. Particularly, the structure of the support element of FIGS. 9A and 9B is only an exemplary description, and other shapes of the support element 430 are also available. In other words, the support element 430 mainly supports the reflecting unit 410 and the receiving unit 420, and enables each receiving unit 420 have different heights H1, H2, and H3 to receive the sunlight 110a reflected by the reflecting unit 410. Therefore, the shape is only required to satisfy the design, instead of being limited to FIGS. 9A and 9B. In addition, in order to support the reflecting unit 410 and the receiving unit 420, a material of the support element 430 may be aluminium alloy, other alloys, or other appropriate weight carrying materials.

In this embodiment, the solar concentration device 400 is applicable to the high latitude region, for example, a region with the latitude larger than 23.5 degrees. For example, the solar concentration device is disposed on a position of north latitude 55 degrees, and the reflecting surface of the reflecting unit is made to face a direction, in which the direction is the south. In this manner, the reflecting unit 410 and the receiving units 420 are fixed on the support element 430, and each receiving unit 420 has a different height H1, H2, or H3, so at summer noon, the sunlight are mostly reflected to the receiving unit 420 with the lower height, as shown in FIG. 9A. At winter noon, the zenith height of the sun is relatively lower, so the sunlight is mostly reflected to the receiving unit 420 with the higher height, as shown in FIG. 9B. In the above-mentioned, the north latitude is an exemplary description, and the present invention is not limited here.

In other words, the solar concentration device of this embodiment uses the plurality of receiving units 420 with different heights, and enables the receiving units 420 face the reflecting unit 410 to receive the sunlight reflected by the reflecting units 410 under different times, in which the reflecting unit and the receiving units are fixed on the support element, as shown in FIG. 9A or 9B. In this manner, the solar concentration device 400 may effectively reflect the sunlight 110a without any complicated tracking device, thus having preferred photoelectric conversion efficiency or light utilization rate, and lower fabricating cost.

To sum up, the solar tracking and concentration device of the present invention at least has the following efficacies. Firstly, the solar tracking and concentration device uses the reflecting unit to reflect or concentrate the sunlight, and uses the controlling device to control the receiving unit to move along the first direction to receive the reflected and the concentrated sunlight according to the position and the time of the reflecting unit, such that the receiving unit has the preferred light intensity per unit area. In addition, the controlling device also controls the rotation angle of the support element connecting the reflecting unit and the receiving unit according to the position and the time of the reflecting unit, such that the solar tracking and concentration device has the three-dimensional solar tracking mechanism.

In addition, the solar tracking and concentration device further has a plurality of reflecting units, and the controlling device controls the receiving unit to move along the first direction and controls the rotation angle of the receiving unit facing one of the plurality of reflecting units according to the position and the time of the reflecting unit, such that the receiving unit may receive the sunlight reflected and concentrated by different reflecting units at any moment without rotating the reflecting units, so as to improve the actuation stability of the solar tracking and concentration device.

In other words, the solar tracking and concentration device of the present invention has a preferred photoelectric conversion efficiency, a simpler solar tracking mechanism, a stable actuation mechanism mechanical actuation mechanism, and a lower fabricating cost. In addition, the present invention further provides a method applicable to the solar tracking and concentration device.

In addition, the solar concentration device of the present invention is disposed on the high latitude region, and uses the plurality of receiving units to respectively receive the sunlight reflected by the reflecting unit under different times, in which the receiving units and the reflecting unit are fixed on the support element. Particularly, the solar concentration device may effectively reflect the sunlight to the receiving unit without rotating any means, thereby having a simpler concentration mechanism, a preferred light utilization rate, and a lower fabricating cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A solar tracking and concentration device, comprising:
   a plurality of reflecting units, for reflecting and concentrating sunlight, and each reflecting unit comprising a reflecting surface;
   a receiving unit, receiving the sunlight reflected by one of the reflecting units, and comprising a receiving surface, wherein the receiving unit and one of the different reflecting units respectively face each other at different times, and the receiving unit is adapted to move along a first direction;
   a controlling device, for controlling a rotation angle of one of the reflecting units according to a position and a time of the reflecting unit, wherein the controlling device is adapted to control a rotation angle of the receiving unit facing one of the reflecting units and control a first moving position of the receiving unit moving along the first direction according to positions and times of the reflecting units; and
   a sensing device, disposed on the receiving unit to detect an inclination direction of the at least one reflecting unit, and adapted to output a first feedback signal to the controlling device to calibrate a direction of the at least one reflecting unit facing the sun.

2. The solar tracking and concentration device according to claim 1, wherein the one of reflecting units comprises a plurality of reflecting mirrors, and each reflecting mirror is adapted to reflect the sunlight on the receiving unit.

3. The solar tracking and concentration device according to claim 2, wherein each reflecting mirror is a plane mirror.

4. The solar tracking and concentration device according to claim 2, wherein each reflecting mirror is a concave mirror.

5. The solar tracking and concentration device according to claim 1, wherein the one of reflecting units is a concave mirror.

6. The solar tracking and concentration device according to claim 1, wherein the receiving unit is a photoelectric unit, adapted to convert the sunlight to an electric energy.

7. The solar tracking and concentration device according to claim 6, wherein the photoelectric unit is a solar Grossel.

8. The solar tracking and concentration device according to claim 7, wherein the receiving unit is a photo-thermal unit, adapted to convert the sunlight to a thermal energy.

9. The solar tracking and concentration device according to claim 1, wherein the controlling device comprises:
    a real time clock (RTC), adapted to generate a time signal of the one of reflecting units;
    a micro control unit (MCU), for generating a control sequence signal according to a position signal of the one of reflecting units and the time signal;
    a memory storage unit, storing the position signal, the time signal, and the control sequence signal;
    a first rotation control unit, adapted to accept the control sequence signal to control the rotation angle of the support element; and
    an input/output unit, adapted to deliver the first feedback signal of the sensing device to calibrate the direction of the one of reflecting units facing the sun.

10. The solar tracking and concentration device according to claim 9, wherein the position signal is one selected from among a longitude signal, a latitude signal, and a height signal, or a combination thereof.

11. The solar tracking and concentration device according to claim 9, wherein the controlling device further comprises a data transmission device, adapted to load the position signal to the controlling device.

12. The solar tracking and concentration device according to claim 11, wherein the data transmission device is a serial port device or a parallel port device.

13. The solar tracking and concentration device according to claim 9, wherein the controlling device further comprises a global positioning system (GPS) receiver or a broadcast system receiver, for calibrating or fine-tuning the time signal of the RTC.

14. The solar tracking and concentration device according to claim 1, wherein the sensing device comprises a first containing area extending along a second direction and a first moving member disposed in the first containing area, a plurality of first sensing members is disposed in the first containing area, the first sensing members sense a first moving position of the first moving member to detect a first inclination angle of the one of reflecting units along the second direction, and the first moving member moves along the second direction.

15. The solar tracking and concentration device according to claim 14, wherein the first direction is a south-to-north direction or a north-to-south direction.

16. The solar tracking and concentration device according to claim 1, further comprising a plurality of photo sensors, disposed on the periphery of the receiving unit, wherein the photo sensors detect the sunlight reflected by one of the reflecting units to the receiving unit, and are adapted to output a second feedback signal to the controlling device to calibrate a direction of the receiving unit facing one of the reflecting units.

17. The solar tracking and concentration device according to claim 16, wherein the first direction is a vertical direction.

18. The solar tracking and concentration device according to claim 16, wherein the reflecting surfaces of the reflecting units are disposed back to back.

19. The solar tracking and concentration device according to claim 16, wherein the reflecting surfaces of the reflecting units are disposed face to face.

20. The solar tracking and concentration device according to claim 16, wherein the controlling device comprises:
    a real time clock (RTC), adapted to generate a time signal of the reflecting units;
    a micro control unit (MCU), generating a control sequence signal according to a position signal of the reflecting units and the time signal;
    a memory storage unit, storing the position signal, the time signal, and the control sequence signal;
    a tracking control unit, adapted to accept the control sequence signal to control the first moving position of the receiving unit moving along the first direction, and to control the direction of the receiving unit facing one of the reflecting units;
    a first rotation control unit, adapted to accept the control sequence signal to control the rotation angle of the receiving unit facing one of the reflecting units; and
    an input/output unit, adapted to deliver the second feedback signal of the photo sensors to calibrate the direction of the receiving unit facing the reflecting units.

21. The solar tracking and concentration device according to claim 20, wherein the controlling device further comprises a second rotation control unit, adapted to accept the control sequence signal to control the rotation angle of each reflecting unit.

22. The solar tracking and concentration device according to claim 16, wherein the sensing device comprises a first containing area extending along a second direction and a first moving member disposed in the first containing area, a first sensing member is disposed in the first containing area, the first sensing member senses a second moving position of the first moving member to detect a first inclination angle of the reflecting units along the second direction, and the first moving member moves along the second direction.

23. The solar tracking and concentration device according to claim 22, wherein a plurality of first sensing members is further disposed in the first containing area.

24. The solar tracking and concentration device according to claim 22, wherein the sensing device further comprises a second containing area extending along a third direction and a second moving member disposed in the second containing area, a plurality of second sensing members is disposed in the second containing area, the second sensing members sense a third moving position of the second moving member to detect a second inclination angle of the solar plane along the third direction, and the second moving member moves along the third direction.

25. The solar tracking and concentration device according to claim 22, wherein the second direction is an east-to-west direction or a west-to-east direction.

26. The solar tracking and concentration device according to claim 24, wherein the third direction is a south-to-north direction or a north-to-south direction.

* * * * *